(12) United States Patent
Maeno et al.

(10) Patent No.: US 6,571,364 B1
(45) Date of Patent: May 27, 2003

(54) SEMICONDUCTOR INTEGRATED CIRCUIT DEVICE WITH FAULT ANALYSIS FUNCTION

(75) Inventors: Hideshi Maeno, Tokyo (JP); Tokuya Osawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,530

(22) Filed: Dec. 9, 1999

(30) Foreign Application Priority Data

Jul. 26, 1999 (JP) ............................. 11-211107

(51) Int. Cl.[7] ...................... G01R 31/28; G11C 29/00
(52) U.S. Cl. ...................... 714/736; 714/720; 714/730
(58) Field of Search ............................. 714/718, 726, 714/729, 733, 736, 819, 719, 720, 735, 730; 365/200, 201

(56) References Cited

U.S. PATENT DOCUMENTS 5,636,225 A * 6/1997 Osawa ........................ 714/718
5,703,818 A * 12/1997 Osawa ........................ 365/200
5,724,367 A * 3/1998 Osawa et al. ................ 714/720
5,784,323 A * 7/1998 Adams et al. ............... 365/201
5,815,512 A   9/1998 Osawa et al.
6,067,262 A * 5/2000 Irrinki et al. ................ 365/201
6,275,963 B1 * 8/2001 Maeno et al. ............... 714/726
6,360,342 B1 * 3/2002 Lee et al. .................... 714/718

* cited by examiner

Primary Examiner—Albert Decady
Assistant Examiner—Matthew Dooley
(74) Attorney, Agent, or Firm—Burns, Doane, Swecker & Mathis, LLP

(57) ABSTRACT

A semiconductor integrated circuit device with fault analysis function performs test operation for a memory circuit (such as a RAM) in which a comparison control circuit (6) generates a comparison control signal CCMP in order to select one or more memory cells in each memory cell group (34, 35, 36 and 37) corresponding to a single bit, a specified row, a specified bit, or a specified pattern, and then outputs the comparison control signal CCMP to scan flip flops (2, 3, 4 and 5) each including a comparator (292). The comparator (292) performs the comparison operation between data and expected values EXP and then outputs a comparison result only when address signals are input and data are red from memory cells, as the object of test, addressed by these address signals.

16 Claims, 29 Drawing Sheets

FIG.24A      FIG.24B
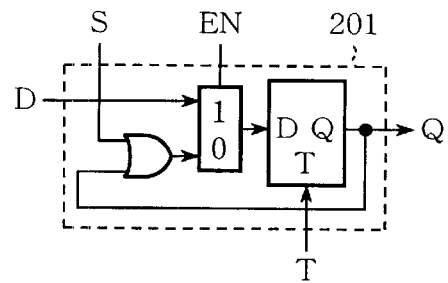 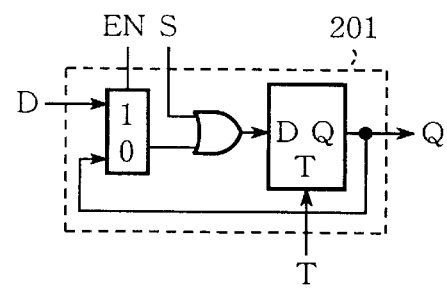
FIG.25A
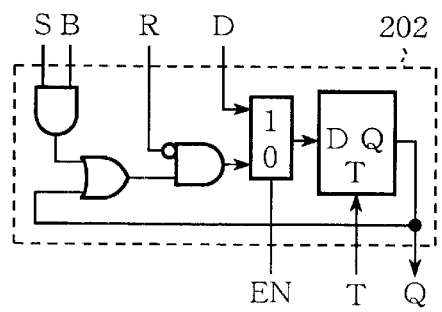
FIG.25B
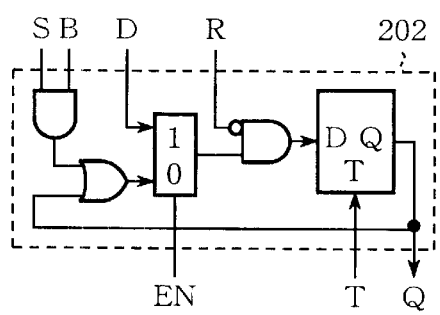
FIG.25C
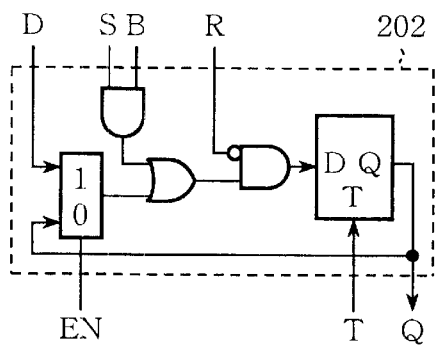

SEMICONDUCTOR INTEGRATED CIRCUIT DEVICE WITH FAULT ANALYSIS FUNCTION

BACKGROUND OF THE INVENTION

1. Field of the Invention

The present invention relates to a semiconductor integrated circuit with fault analysis function capable of testing a memory circuit such as a RAM incorporated therein and then performing fault analysis operation in detail.

2. Description of the Related Art

A conventional test circuit for testing a memory circuit portion incorporated in a semiconductor integrated circuit device is disclosed, for instance, in U.S. Pat. No. 5,815,512 (corresponding to a Japanese laid open publication No. JP-A-8/94718).

FIG. 1 is a circuit diagram showing a scan flip flop to be used in the test of a memory circuit such as a RAM (Random Access Memory). In FIG. 1, the reference numbers 2–5 and 2 91 each designates a scan flip flop (SFF), and 292 denotes a comparator incorporated in the scan flip flop (SFF) 291. This comparator 292 compares the output from a memory circuit D such as a RAM with an expected value EXP that has been prepared previously, and then outputs a comparison to the outside of the scan flip flop (SFF) 291. The reference number 293 indicates a flip flop (FF) for temporarily storing the comparison result transferred from the comparator 292.

FIG. 2 is a block diagram showing a RAM as a memory circuit and a conventional test circuit. In FIG. 2, the reference number 301 designates a RAM as a memory circuit, 291 denotes four scan flip flops connected in series that form a scan path to be used for a memory test operation of the RAM 301. The scan flip flop 291 is the same as the scan flip flop shown in FIG. 1 in configuration.

FIG. 3 is a diagram showing a configuration of the RAM 301 of 32 words and 4 bits as the object of test. In FIG. 3, the reference character WD designates a write-in driver circuit, SA denotes a sense amplifier, and 311 and 312 indicate a Y address decoder and a X address decoder, respectively. The reference number 313 designates each of column selectors, and 314 denotes each of memory cell groups G0 to G4. Each memory cell group 314 has thirty-two memory cells 0 to 31.

The reference character DI< > (DI<0> to DI<3>) designates input data signals that are input through data input terminals to the RAM 301, and DO< > (DO<0> to DO<3>) denotes output data signals that are output to outside of the RAM 301 through data output terminals.

The reference number A< > (XA< > and YA< >) designates address signals that are input through address terminals to the RAM 301, and WE denotes a write enable signal that is input through the write enable terminal.

In general, as shown in FIG. 3, each memory cell group corresponding to one bit data input/output is arranged in a two dimension arrangement (for example, in a 4×8 arrangement). Each of the memory cells in the memory cell group 314 in the RAM 301 shown in FIG. 3 is selected by using the X address (XA<2>, XA<1> and XA<0>) and the Y address (YA<1> and YA<2>).

In each of the memory cell groups (G0 to G3) 314 in the RAM 301 shown in FIG. 3 comprises thirty-two memory cells (4×8=32). Each of the memory cells is selected by one of addresses 0 to 31. For example, when the address signals are XA<2>=1, XA<1>=0, XA<0>=1, and YA<1>=1 and YA<0>=0, the output X5 in the X decoder 312 is activated to select the output Y2 of each of the column selectors 313. As a result, the memory cell addressed by the address 32 in each of the memory cell group 314 is selected.

Next, a description will be given of the test operation for the conventional example.

In the RAM 301, the data output signals DO<0>, DO<1>, DO<2> and DO<3> of four bits that have been read from the memory cell groups (G0 to G3) 314 are output to corresponding flip flops 291 in the scan path shown in FIG. 2, respectively.

Because the four scan flip flips (SFF) 291 in the conventional example shown in FIG. 2 are connected in series, it takes four clocks to set the value 1 into all of the scan flip flops 291 in serial data transmission. As a result, the values of the output signals outputted from the scan flip flops 291 through the terminal SO becomes SO<0>=1, SO<1>=1, SO<2>=1 and SO<3>=1, respectively.

Next, both the control signals TM and SM are set to TM=1 and SM=1. In this situation, the test operation is executed by using all of the addresses of the RAM 301. That is to say, expected values EXP and a comparison control signal CMP are properly controlled while executing the write-in operation and read-out operation for all of the memory cells in the RAM 301 by using the all of the addresses. For example, the comparison instruction to initiate the comparison operation is given to the comparator 292 under CMP=1. As a result, because the value obtained through the data output terminal DO< > from a defective memory cell in the RAM 301 is not equal to the expected value, the output of the comparator incorporated in the scan flip flop 291 (that corresponds to the comparator 292 shown in FIG. 1) becomes zero and the scan flip flop 291 corresponding to this comparator is reset to zero in synchronization with the clock signal T.

For example, when the scan flip flop (SFF<2>) 291 corresponding to the data output signal DO<2> from the memory cell in the RAM 301 detects a defective memory cell, the output signal from the scan flip flop (SFF<2>) 291 has the value of zero (SO<2>=0). Other outputs from other scan flip flops (SFF<0>, SFF<1>, and SFF<3>) 291 maintain the value of one (SO<0>=1, SO<1>=1, and SO<3>=1).

Next, both the control signals TM and SM are set to TM=0 and SM=1 and then test results SO<0> are shifted to the outside through the output terminal SO of the scan flip flop 291 in the final stage. When the test results are output serially, the output signal SO<0> becomes the serial output data SODO shown in FIG. 2.

Because the conventional semiconductor integrated circuit has the configuration described above, the test results from the memory cell group G3 are transferred to and then stored in the scan flip flop SFF<3>, the test results from the memory cell group G2 are transferred to and then stored in the scan flip flop SFF<2>, the test results from the memory cell group G1 are transferred to and then stored in the scan flip flop SFF<1>, and the test results from the memory cell group G0 are transferred to and then stored in the scan flip flop SFF<0>.

Accordingly, it is difficult to diagnose and distinguish a kind of defect in the conventional semiconductor integrated circuit device, for example, the defect is whether a fault of a single bit in a memory cell, of a bit line, or of a word line.

SUMMARY OF THE INVENTION

Accordingly, an object of the present invention is, with due consideration to the drawbacks of the conventional technique, to provide a semiconductor integrated circuit device with fault analysis function capable of efficiently performing the test operation for a memory section such as a RAM, and of easily performing a fault analysis in detail.

In accordance with one aspect of the present invention, a semiconductor integrated circuit device with fault analysis function has a memory circuit, a scan path and a comparison control circuit. The memory circuit has a plurality of memory cells that are divided into a plurality of memory cell groups in which data stored in the memory cells addressed by address signals are read and then output. The scan path has a plurality of scan flip flops placed corresponding to the plurality of memory cell groups. Each scan flip flop includes a comparator for comparing the data read from the memory cells with expected values that have been previously prepared and then outputting a comparison result. The comparison control circuit inputs control signals and the address signal. The comparison control circuit then generates a comparison control signal in order to initiate comparison operation between the data and the expected values by the comparators only when the memory cells addressed by the address signals are equal to memory cells of at least one or more in each memory cell group within a range specified by the control signals. Then, the comparison control circuit outputs the comparison control signal to each of the plurality of scan flip flops.

In this embodiment, the comparison control circuit outputs the comparison control signal to the plurality of scan flip flops in order to initiate comparison operation only for memory cells which are addressed by a specified single address.

In this embodiment, the comparison control circuit outputs the comparison control signal to the plurality of scan flip flops in order to initiate comparison operation for all of memory cells other than memory cells which are addressed by a specified single address.

In this embodiment, the comparison control circuit outputs the comparison control signal to the plurality of scan flip flops in order to initiate comparison operation for memory cells in the memory cell groups corresponding to a word line.

In this embodiment, the comparison control circuit outputs the comparison control signal to the plurality of scan flip flops in order to initiate comparison operation for memory cells in the memory cell groups addressed by a plurality of word lines the number of which is less than the number of all of word lines in each memory cell group.

In this embodiment, the memory cell groups having memory cells that are object memory cells for the comparison operation specified by the comparison control signal generated by and output from the comparison control circuit are addressed by a plurality of word lines that are adjacent to each other.

In this embodiment, the comparison control circuit outputs to the plurality of scan flip flops the comparison control signal in order to initiate comparison operation only for memory cells in the memory cell groups corresponding to word lines that are not adjacent to each other.

In this embodiment, the comparison control circuit outputs to the plurality of scan flip flops the comparison control signal in order to initiate comparison operation only for memory cells in each memory cell group corresponding to a bit line.

In this embodiment, the comparison control circuit outputs to the plurality of scan flip flops the comparison control signal in order to initiate comparison operation only for memory cells in each memory cell group corresponding to a plurality of bit lines.

In this embodiment, the memory cell groups having memory cells as object memory cells for comparison operation indicated by the comparison control signal generated by and output from the comparison control circuit are memory cell groups indicated by a plurality of bit lines that are adjacent to each other.

In this embodiment, the memory cell groups having memory cells as object memory cells for comparison operation indicated by the comparison control signal generated by and output from the comparison control circuit are memory cell groups indicated by bit lines other than a plurality of bit lines that are adjacent to each other.

In this embodiment, the comparison control circuit outputs to the plurality of scan flip flops the comparison control signal to initiate comparison operation only for alternate memory cells arranged in a lattice shape in each memory cell group.

In accordance with another aspect of the present invention, a semiconductor integrated circuit device with fault analysis function further has a repetitive control circuit for inputting the comparison result from the comparator incorporated in each of the plurality of scan flip flops. The repetitive control circuit generates a control signal to switch the memory cells specified by the comparison control signal output from the comparison control circuit according to the comparison result. Then, the repetitive control circuit outputs the control signal to the comparison control circuit in order to perform the comparison operation for the memory cells repeatedly.

A semiconductor integrated circuit device with fault analysis function in accordance with still another aspect of the present invention further has AND circuits arranged in first and second stages. The AND circuits in first stage perform AND operation between outputs from adjacent scan flip flops in the plurality of scan flip flops that form the scan path. The AND circuits in second stage perform AND operation between outputs from specified AND circuits in the AND circuits in first stage.

In accordance with another aspect of the present invention, a semiconductor integrated circuit device with fault analysis function further shift registers for providing the address signals serially and simultaneously to both the memory circuit and the comparison control circuit.

In this embodiment, the shift registers are placed corresponding to each of X address signals and Y address signals in the address signals.

BRIEF DESCRIPTION OF THE DRAWINGS

These and other objects, features, aspects and advantages of the present invention will become more apparent from the following detailed description of the present invention when taken in conjunction with the accompanying drawings, in which:

FIGS. 24A and 24B are diagrams showing two configurations of shift resisters in a control circuit shown in FIG. 23;

FIGS. 25A to 25C are diagrams showing three configurations of other shift resisters in the control circuit shown in FIG. 23;

FIGS. 30A to 31D are block diagrams showing another configuration of the flag signal generation circuit.

DESCRIPTION OF THE PREFERRED EMBODIMENTS

Other features of this invention will become apparent through the following description of preferred embodiments that are given for illustration of the invention and are not intended to be limiting thereof.

First Embodiment

Figure 1:
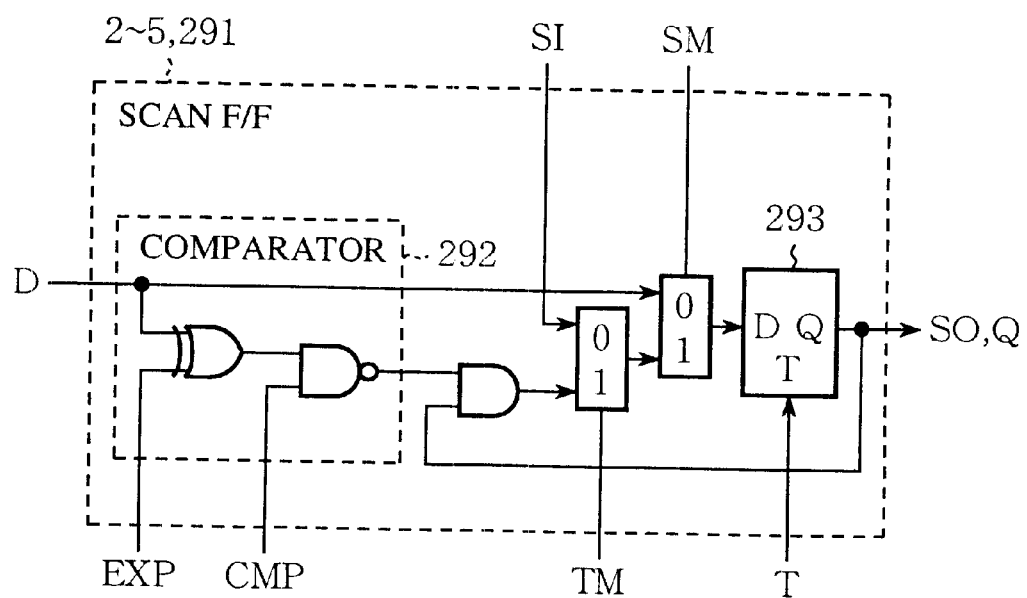
FIG. 1 is a diagram showing a circuit diagram of a scan flip flop to be used in a test for a memory circuit such as a RAM.
Figure 2:
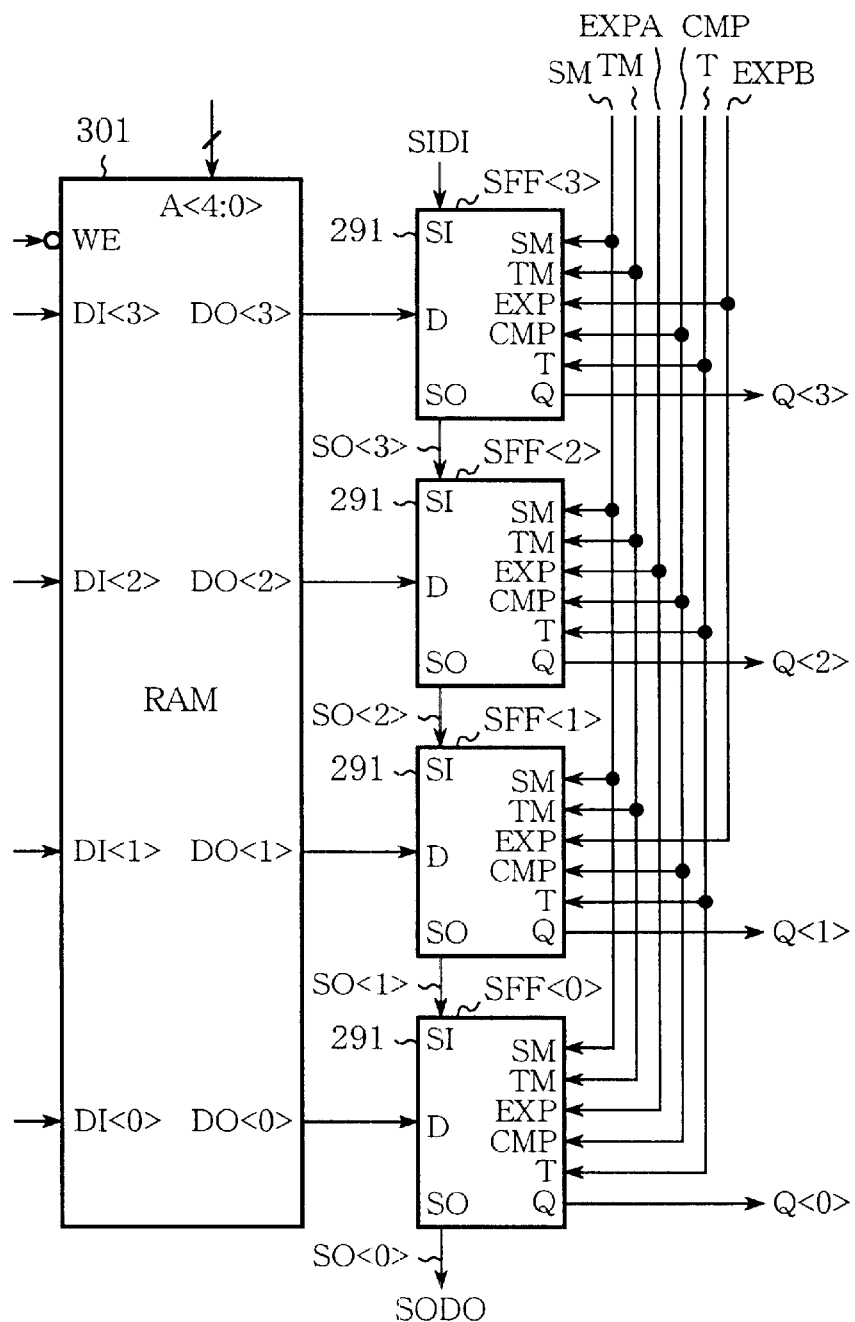
FIG. 2 is a block diagram showing a RAM and a conventional test circuit.
Figure 4:
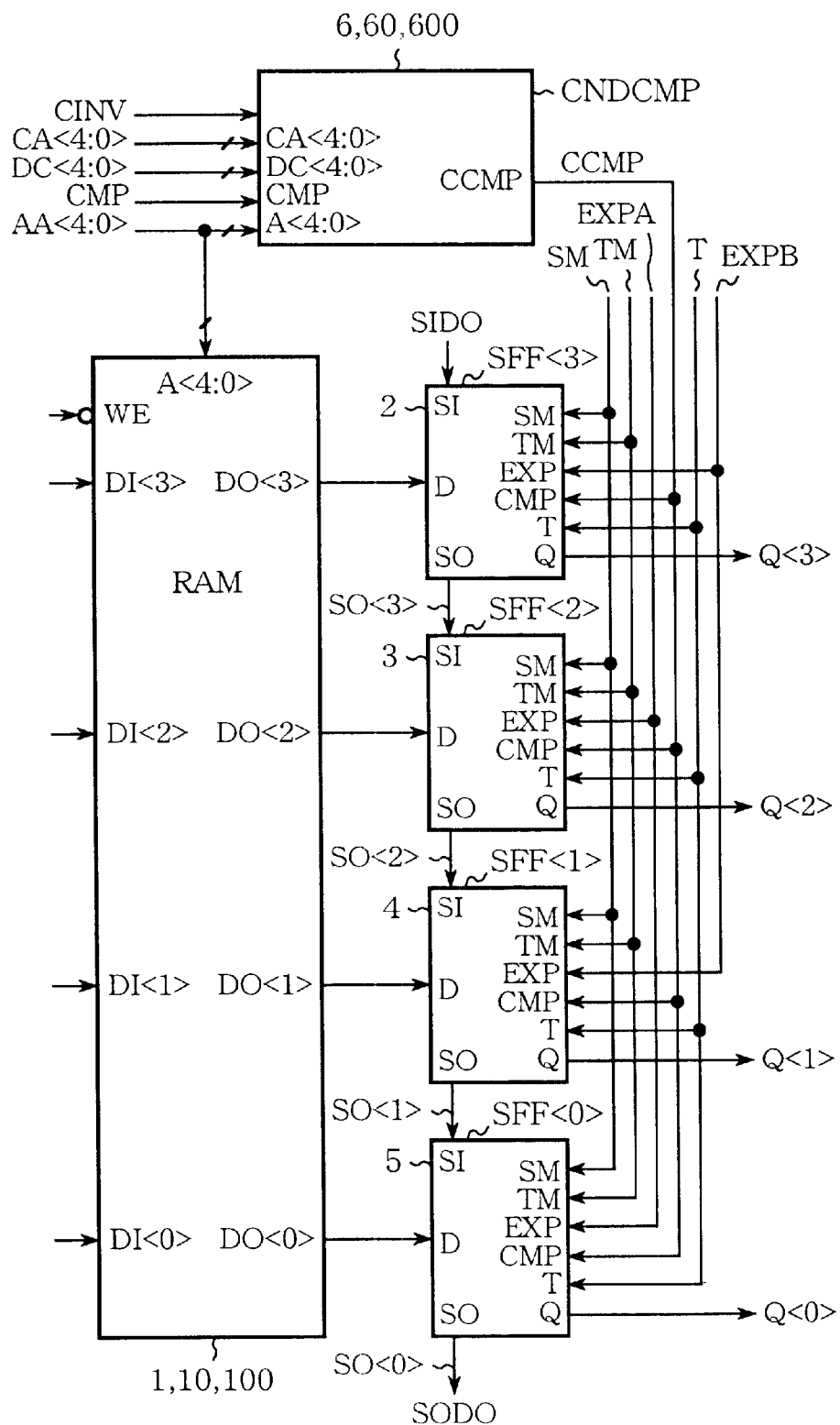
FIG. 4 is a block diagram showing a configuration of a semiconductor integrated circuit device with fault analysis function according to the first embodiment of the present invention.

FIG. 4 is a block diagram illustrating a configuration of the semiconductor integrated circuit device with fault analysis function according to the first embodiment of the present invention. In FIG. 4, the reference numbers 1, 10 and 100 each designates a RAM as a memory circuit, and 2, 3, 4 and 5 denote a scan flip flops (SFF). These scan flip flops 2, 3, 4 and 5 are connected in series to form a scan path to be used for testing the RAM 1. Each of the scan flip flops 2, 3, 4 and 5 has the same configuration of the RAM shown in FIG. 1.

The reference numbers 6, 60 and 600 each designates a comparison control circuit (CNDCMP). This comparison control circuit 6 generates a comparison control signal CCMP to be used for controlling a comparison operation of the comparator 292 (corresponding to the comparator 292 shown in FIG. 1) in each of the scan flip flops 2, 3, 4 and 5 based on a control signal transferred and control signals DC< > (Don't Care), CA< > (Care Address), A< > (XA< >, YA< >, Address), CINV (Care Invert), and CMP (Compare) generated by and transferred from a self test controller (not shown), or a CPU, or other control devices (not shown). The comparison control circuit 6 then outputs the comparison control signal CCMP to the scan flip flops 2, 3, 4 and 5.

Figure 5:
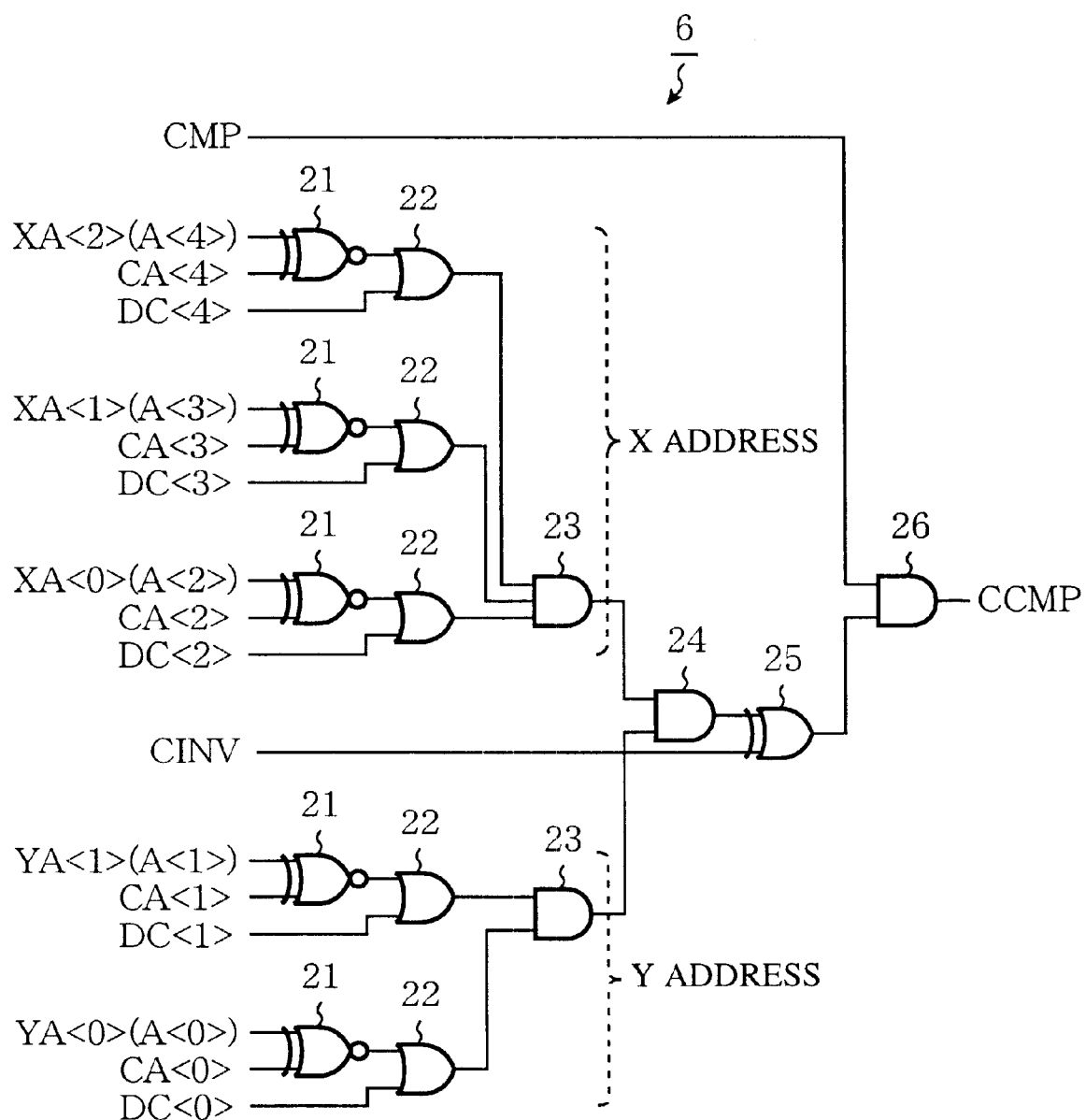
FIG. 5 is a circuit diagram showing a configuration of a comparison control circuit in the semiconductor integrated circuit shown in FIG. 4.

FIG. 5 is a circuit diagram depicting a configuration of the comparison control circuit 6 in the semiconductor integrated circuit shown in FIG. 4. As shown in FIG. 5, this comparison control circuit 6 comprises XNOR circuits 21, OR circuits 22, AND circuits 23, an AND circuit 24, a XOR circuit 25, and AND circuit 26. Each pair of the XNOR circuits 21 and the OR circuits 22 is placed for each of addresses XA<2> (A<4>), XA<1> (A<3>),XA<0> (A<2>),YA<1> (A<1>)and YA<0> (A<0>). The AND circuits 23 perform AND operation for each of X address and Y address. The AND circuit 24 performs AND operation between the operation results from both the AND circuits 23 for X address and Y address. The XOR circuit 25 performs XOR operation between the control signal CINV and the output from the AND circuit 24. The AND circuit 26 performs AND operation between the control signal CMP and the output from the XOR circuit 25. In other words, the comparison control circuit 6 is made up of the XNOR circuit 21 and the OR circuit 22 that are arranged in plural stages and also arranged corresponding to each of the combinations of address signals A<4> to A<0> (x address and Y address), the control signals CA<4> to CA<0>, and the DC<4> to DC<0>, the AND circuits 23, the XOR circuit 25, and the AND circuit 26.

Figure 3:
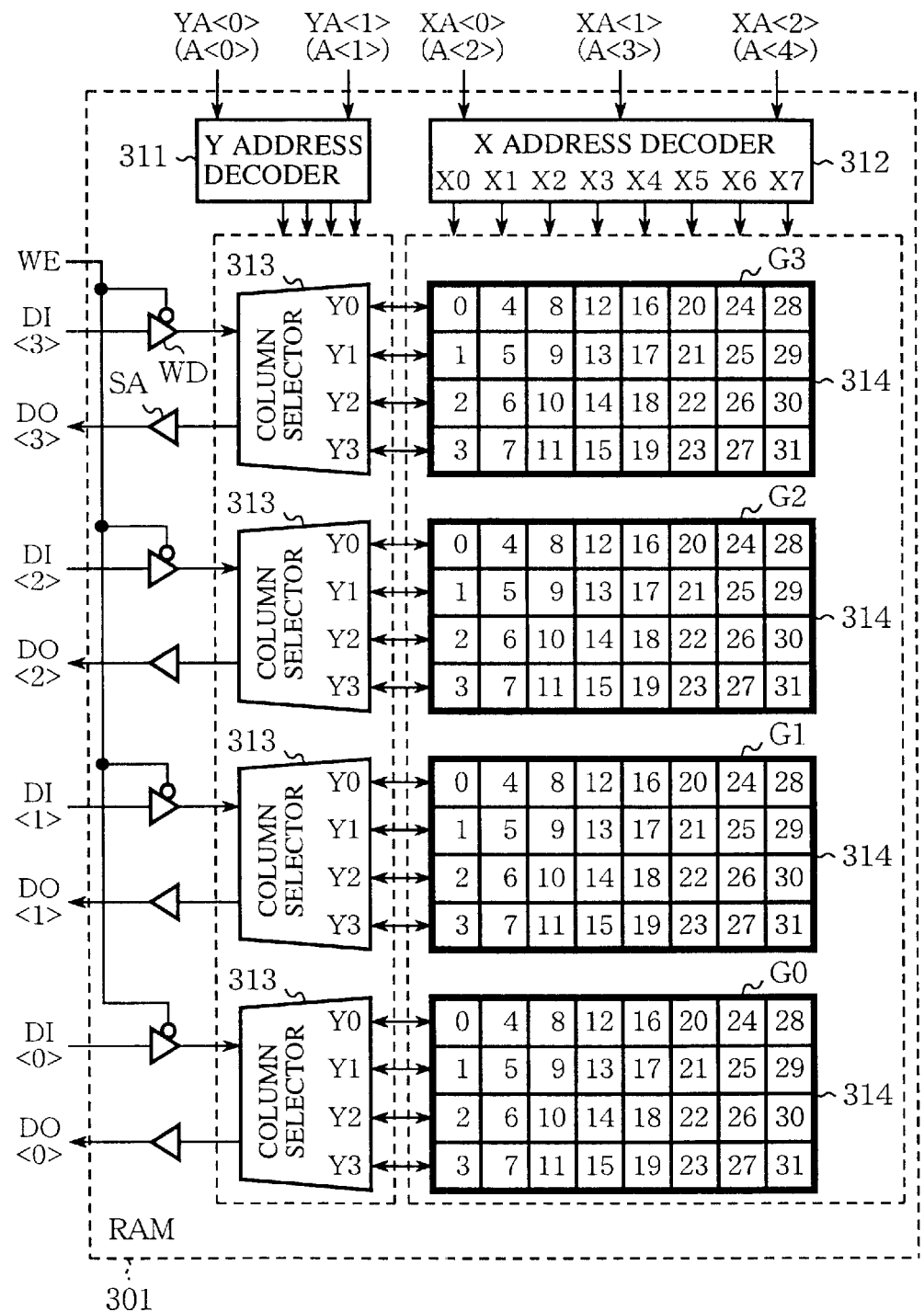
FIG. 3 is a diagram showing a configuration of the RAM that is the object of test.
Figure 6:
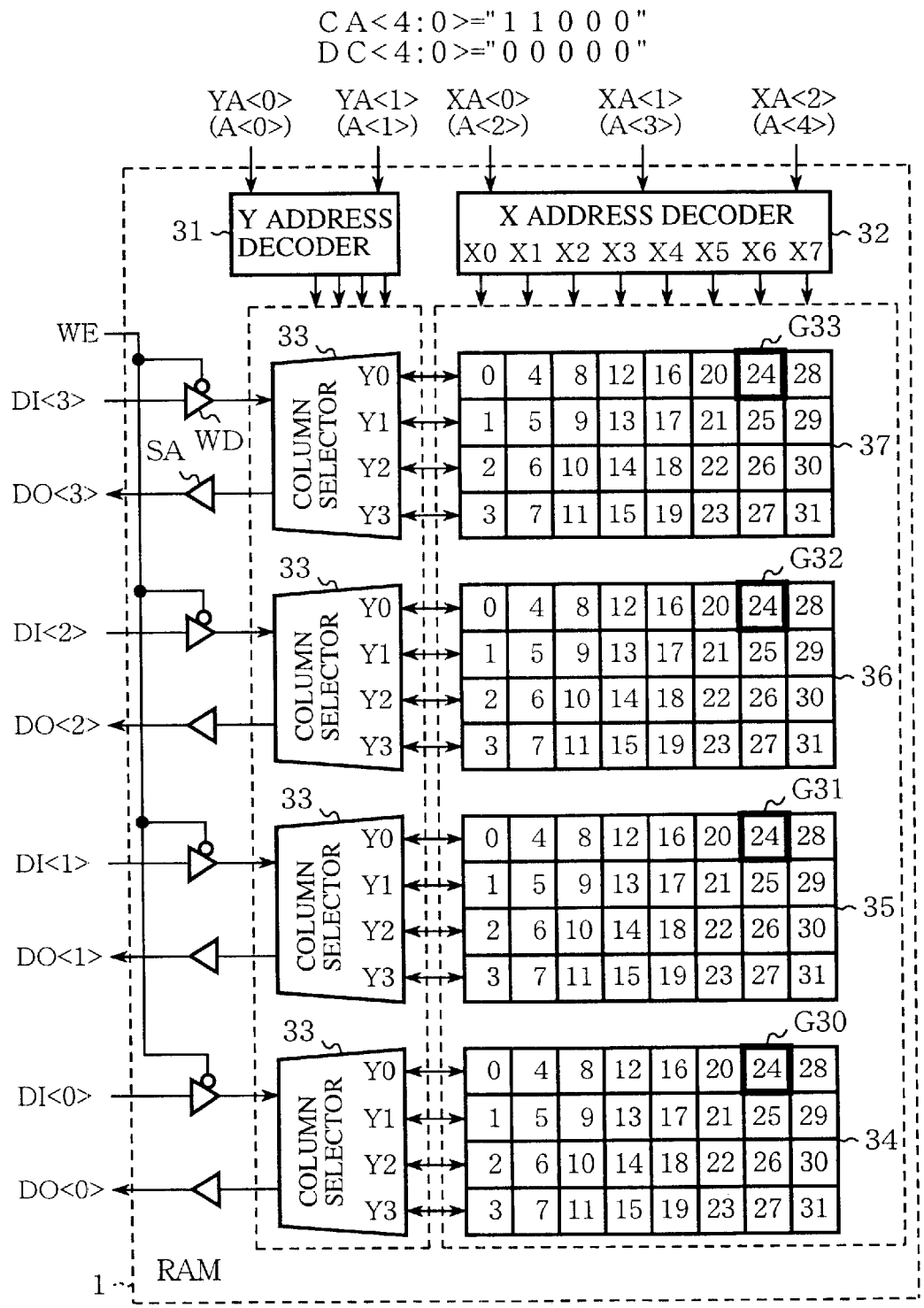
FIG. 6 is a block diagram showing a configuration of a RAM in the semiconductor integrated circuit shown in FIG. 4.

FIG. 6 is a block diagram illustrating a configuration of the RAM 1 in the semiconductor integrated circuit shown in FIG. 4. This RAM 1 has a memory circuit of 32 words×4 bits as the object for test, like the RAM 301 shown in FIG. 3. In FIG. 4, the reference character WD designates each of write driver circuits, and SA each of sense amplifiers. The reference numbers 31 and 32 denote a Y address decoder and a X address decoder, respectively, 33 each of column selectors, and 34 to 37 memory cell groups.

FIG. 6 shows the memory cells G30, G31, G32 and G33 (whose memory cell number is 24 in decimal notation) selected in each of the memory cell groups 34 to 37. The reference symbols DI< > indicate input data signals to be input to the RAM 1 through data input terminals (not shown), and DO< > output data signals to be output from the RAM 1 to the outside through data output terminals (not shown). The reference symbols A< > (XA< > and Y< >) designate the address signals to be input through address terminals (not shown). The reference character WE denotes a write enable signal to be input to the RAM 1 through a write enable terminal (not shown).

Next, a description will be given of the operation of the semiconductor integrated circuit with fault analysis function.

In the comparison control circuit 6 shown in FIG. 6, the XNOR circuit 21 performs XNOR operation between the address signal XA<2> (A<4>) and the control signal CA<4>, and the OR circuit performs OR operation between an operation result from the XNOR circuit 21 and the control signal DC<4>.

Similarly, other XNOR circuits 21 and OR circuits 22 perform the same operations for the address signals XA<1>, XA<0>, YA<1>, and YA<0>. Then, the AND circuit 23 performs AND operation between the results of the OR operations from the OR circuits 22. The AND circuit 24 performs AND operation between the outputs from the AND circuits 23 that are placed for X address and Y address. The XOR circuit 25 performs XOR operation between the output from the AND circuit 24 and the control signal CINV. Finally, the AND circuit 26 performs AND operation between the output from the XOR circuit 25 and the control signal CMP. The signal CCMP as the result of the logical arithmetic operation above is provided to each of the scan flip flops 2, 3, 4 and 5.

Next, the test operation to the memory cells in the RAM 1 shown in FIG. 6 will be explained.

The same address signal AA<4:0> (A<4>, A<3>, A<2>, A<1> and A<0>) is provided to both the RAM 1 and the comparison control circuit 6 simultaneously. The data output signals DO<3:0> (DO<3>, DO<2>, DO<1> and DO<0> ) that are read from the memory cell groups 34, 25, 26 and 37 that constitute the RAM 1 are transferred to corresponding scan flip flops 2, 3, 4 and 5 in the scan path, respectively.

The test to the memory cells in the RAM 1 is performed by the following procedure.

First, the procedure begins with setting the control signals TM=0 and SM=1, respectively, prior to the start of the test. In this situation, the uppermost-stage scan flip flop 2 in the scan path inputs the input data SODO=1 through the input terminal SI.

As shown in FIG. 4, since the scan flip flops 2, 3, 4 and 5 are connected in series in order to constitute the scan path, it therefore requires four clocks to set the value 1 in all of them. As a result, the scan flip flops 2, 3, 4 and 5 output the signals SO< >=1 (SO<3>=1, SO<2>=1, SO<1>=1 and SO<0>=1).

The next step is to set the control signals TM and SM both at 1. In this situation, this is followed by testing the RAM 1 at every address. That is, the test is carried out by writing test data in and reading out of the RAM 1 and by comparing data read from the RAM 1 with expected values EXP while at the same time appropriately controlling comparison control signal CCMP (for example, which indicates a comparison when it is 1).

If there is a defective portion in the RAM 1, because the output data DO< > from the RAM 1 through data output terminals differ from the expected values EXP, the output of the comparators in the scan flip flop corresponding to the defective portion goes to zero, and this scan flip flop is then reset to zero in synchronization with the clock signal T.

For example, when detecting a fault of a memory cell, the scan flip flop (SFF<2>) 3, that corresponds to the data output signal DO<2> that has been read this memory cell in the RAM 1 selected by a provided address, outputs an output signal SO<2> of zero (SO<2>=0). On the other hand, the output signals from the other scan flip flops 2, 4 and 5, however, remain unchanged, i.e. SO<3>=1, SO<1>=1, and SO<0>=1.

Next, the control signals TM and SM are set at 0 and 1 (TM=0 and SM=1), respectively, followed by the shifting out the test results SODO<0> from the final-stage scan flip flop 5 in the scan path. The external LSI tester (not shown) reads these test results in order to perform the fault analysis operation.

By the way, in the semiconductor integrated circuit device with fault analysis function according to the first embodiment shown in FIG. 4, same addresses AA<4:0> (A<4:0>) are provided to both the RAM 1 and the comparison control circuit 6. The control signal CMP to be provided to the comparison control circuit 6 from the self test controller (not shown) is a control signal to specify all memory cells in the RAM 1. The comparison control circuit 6 generates the comparison control signal CCMP to indicate only the initiation of the comparison operation between the data read from the selected memory cell and the expected value according to the address signal AA<4:0>(A<4:0>), and the control signals CA<4:0> and DC<4:0>, and then outputs the generated comparison control signal CCMP to the scan flip flops 2, 3, 4 and 5.

Hereinafter, a description will be given of the operation of the fault analysis by the semiconductor integrated circuit device with fault analysis function according to the first embodiment.

In the following explanation of the present invention, the control signal CA<4:0>=a, b, c, d and e mean CA<4>=a, CA<3>=b, CA<2>=c, CA<1>=d and CA<0>=e, respectively. That is, a following label is used:

A signal name <Start bit number: End bit number>.

Furthermore, the numbers 0 to 31 attached to the respective memory cells that form each of the memory cell groups 34, 35, 36 and 37 in the RAM 1 shown in FIG. 6 are expressed in decimal notation corresponding to the address signals A<4:0>–XXXXX in binary notation. For example, the memory cell specified by the address signal A<4:0>= 11000 in binary notation means the memory cell indicated by the number 24 in decimal notation in each of the memory cell groups 34, 35, 36 and 37.

Further, the address signal A<4> corresponds to the XA<2>, the address signal A<3> corresponds to XA<1>, the address signal A<2> corresponds to XA<0>, the address signal A<1> corresponds to YA<1>, and the address signal A<0> corresponds to YA<0>. The following explanation through all embodiments will use this relationship.

When only the memory cells 24 (G30, G31, G32 and G33) in the memory cell groups 34, 35, 36 and 37 are selected, the self test controller (not shown) generates the control signals CA<4:0>=11000, DC<4:0>=00000 and CINV=0 and outputs them to the comparison control circuit 6.

Next, the comparison control circuit 6 receives these control signals from the self test controller and then generates the comparison control signal CCMP only when the address signal XA< > (A< >) specifies the memory cell 24 because the received control signal CA<4:0>=11000 in binary notation indicates the memory cell 24 in decimal notation. Then, the comparator in each of the scan flip flops (SFF) 2, 3, 4 and 5 compares the data read from the memory cell 24 with the expected data EXP. When both do not match, the scan flip flops 2, 3, 4 and 5 is reset to 0 in synchronization with the clock signal T.

As described above, according to the control signals CA<4:0> (CA<4>, CA<3>, CA<2>, CA<1> and CA<0>) and DC<4:0> (DC<4>, DC<3>, DC<2>, DC<1> and DC<0>) output from the self test controller (not shown), an object memory cell in each of the memory cell groups 34, 35, 36 and 37 is selected and the fault analysis operation to decide whether there is a defective portion such as a defective memory cell in the RAM 1 may be performed.

In the state where the control signals CA< > and DC< > remain at the same values described above, when the self test controller (not shown) generates and then provides the control signal CINV of 1 (CINV=1) to the comparison control circuit 6, the scan flip flops 2, 3, 4 and 5 may perform the comparison operation for all of the memory cells other than the memory cell 24 in each memory cell group in the RAM 1. In this case, it is possible to perform the test whether or not there is a defective portion in all of the memory cells other than the memory cell 24.

Next, a description will be given of the selection operation to select a combination of several memory cells in the memory cell groups 34, 35, 36 and 37 in the RAM 1.

Figure 7:
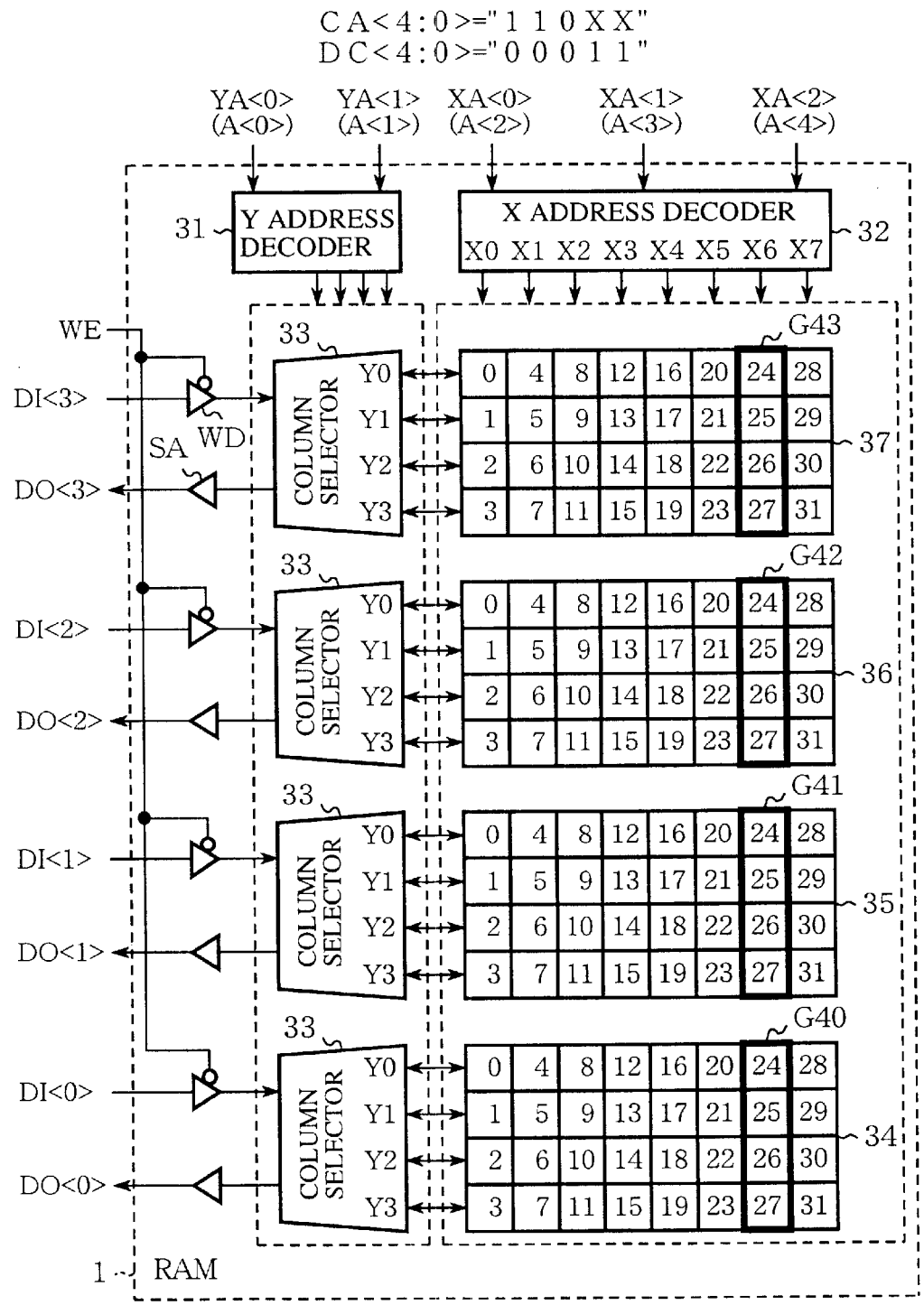
FIG. 7 is a block diagram showing memory cells in the memory cell groups selected in the RAM.

FIG. 7 is a block diagram showing a combination of memory cells selected in the memory cell groups 34, 35, 36 and 37 in the RAM. The combination of the selected memory cells are four memory cells 24, 25, 26 and 27 in each of the memory cell groups 34, 35, 36 and 37.

When the combination of the memory cells in each memory cell group indicated by the reference characters G40, G41, G42 and G43 depicted in FIG. 7 is selected as object memory cells that will be compared with expected values EXP, the self test controller (not shown) generates the control signals CA<4:0>=110XX in binary notation (where "X" indicates both 0 and 1), DC<4:0>=00011 and CINV=0, and then outputs them to the comparison control circuit 6. This control signal DC<4:0>sets DC<i> corresponding to the address YA<i> to the value 1 (DC<i>=1). For example, because the value of DC<1> becomes 1 (DC<1>=1) when DC<4:0>=00011, YA<1> becomes 1 (YA<1>=1) and DC<0> becomes 1 (DC<0> −1), and all of Y0, Y1, Y2 and Y3 in each column selector 33 are selected. The combination of the memory cells 24, 25, 26 and 27 (that are arranged in series) in each of the memory cell groups 34, 35, 36 and 37 is thereby selected.

Accordingly, the comparison control circuit 6 generates the comparison control signal CCMP and then outputs the generated one to the scan flip flops (SFF) 2, 3, 4 and 5 when the address signals to be output to each of the memory cell groups 34, 35, 36 and 37 address the memory cells 24, 25, 26 and 27. Thereby, the comparator in each of the scan flip flops (SFF) 2, 3, 4 and 5 compares the data red from the memory cells 24, 25, 26 and 27 with expected values. When both do not match, the corresponding scan flip flops are set to zero in synchronization with the clock signal T.

By the manner described above, it is possible to select the combinations G40, G41, G42 and G43 of the memory cells in the memory cell groups 34, 35, 36 and 37 corresponding to one word line (specified by one X address=X6) based on the control signals CA< > and DC< > provided from the self test controller (not shown), and to detect whether or not there is a fault in the selected memory cells.

In the state where the control signals CA< > and DC< > remain at the same values described above, when the self test controller (not shown) generates and provides the control signal CINV of 1 (CINV=1) to the comparison control circuit 6, the scan flip flops 2, 3, 4 and 5 may perform the comparison operation to all of the memory cells other than the memory cells 24, 25, 26 and 27 in each memory cell group in the RAM 1. In this case, it is possible to perform the test whether or not there is a defective portion in the memory cells other than the specific memory cells 24, 25, 26 and 27.

Next, a description will be given of the selection operation to select another combination of the memory cells in the memory cell groups 34, 35, 36 and 37 in the RAM 1.

Figure 8:
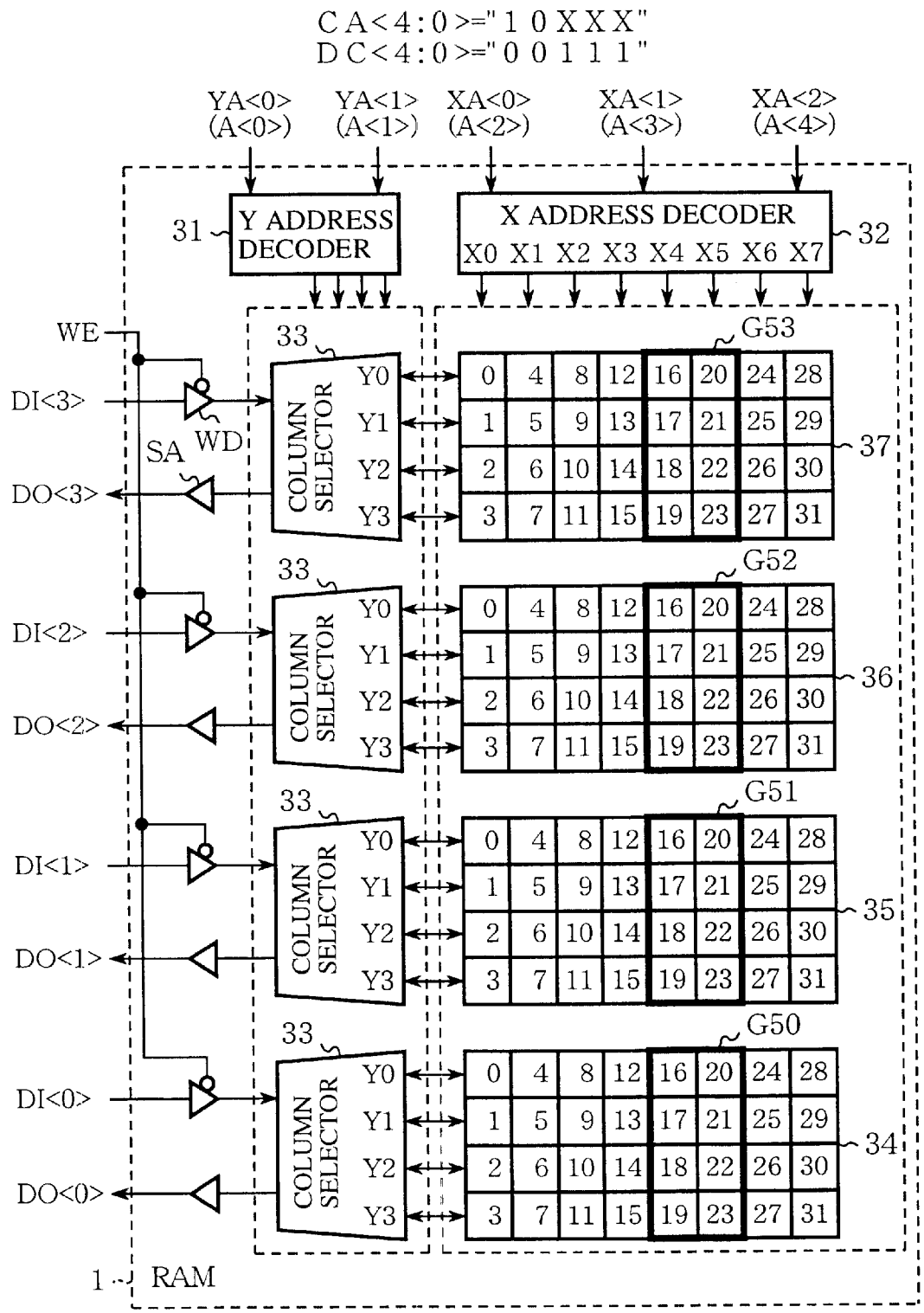
FIG. 8 is a block diagram showing memory cells in the memory cell groups selected in the RAM.

FIG. 8 is a block diagram showing each combination (G50, 51, 52 and 53) of selected memory cells in the memory cell groups in the RAM 1. In FIG. 8, each combination (G50, 51, 52 and 53) of the memory cell groups selected consists of the memory cells 16 through 23.

When the combination of the memory cells in each memory cell group indicated by the reference characters G50, G51, G52 and G53 depicted in FIG. 8 is selected as object memory cells that will be compared with expected values EXP, the self test controller (not shown) generates the control signals CA<4:0>=10XXX in binary notation (where "X" indicates both 0 and 1), DC<4:0>=00111 and CINV=0, and then outputs them to the comparison control circuit 6. This control signal DC<4:0>sets DC<i> corresponding to the address YA<i> to the value 1 (DC<i>=1). For example, because the value of DC<1> becomes 1 (DC<1>=1) when DC<4:0>=00011, YA<1> becomes 1 (YA<1>=1) and DC<0> becomes 1 (DC<0>=1), and all of Y0, Y1, Y2 and Y3 in each column selector 33 are selected. The combination of the memory cells 16 through 23 arranged in two columns (that correspond to two word lines) in each of the memory cell groups 34, 35, 36 and 37 is thereby selected.

Accordingly, the comparison control circuit 6 generates the comparison control signal CCMP and then outputs the generated one to the scan flip flops (SFF) 2, 3, 4 and 5 when the address signals XA< > (A< >) to be output to each of the memory cell groups 34, 35, 36 and 37 specify the memory cells 16 through 23. Thereby, the comparator in each of the scan flip flops (SFF) 2, 3, 4 and 5 compares the data red from the memory cells 16 through 23 with expected values. When both do not match, the corresponding scan flip flops are set to zero in synchronization with the clock signal T.

By the manner described above, it is possible to select the combinations G50, G51, G52 and G53 of the memory cells arranged in two columns in the memory cell groups 34, 35, 36 and 37 corresponding to two word line (specified by one X address=X6) based on the control signals CA< > and DC< > provided from the self test controller (not shown), and to detect whether or not there is a fault in the selected memory cells.

In the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 16 through 23 in each memory cell group in the RAM 1. In this case, it is possible to perform the test whether or not there is a defective portion in the memory cells other than the specific memory cells 16 to 23.

Next, a description will be given of the selection operation to select another combination of the memory cells in the memory cell groups 34, 35, 36 and 37 in the RAM 1.

Figure 9:
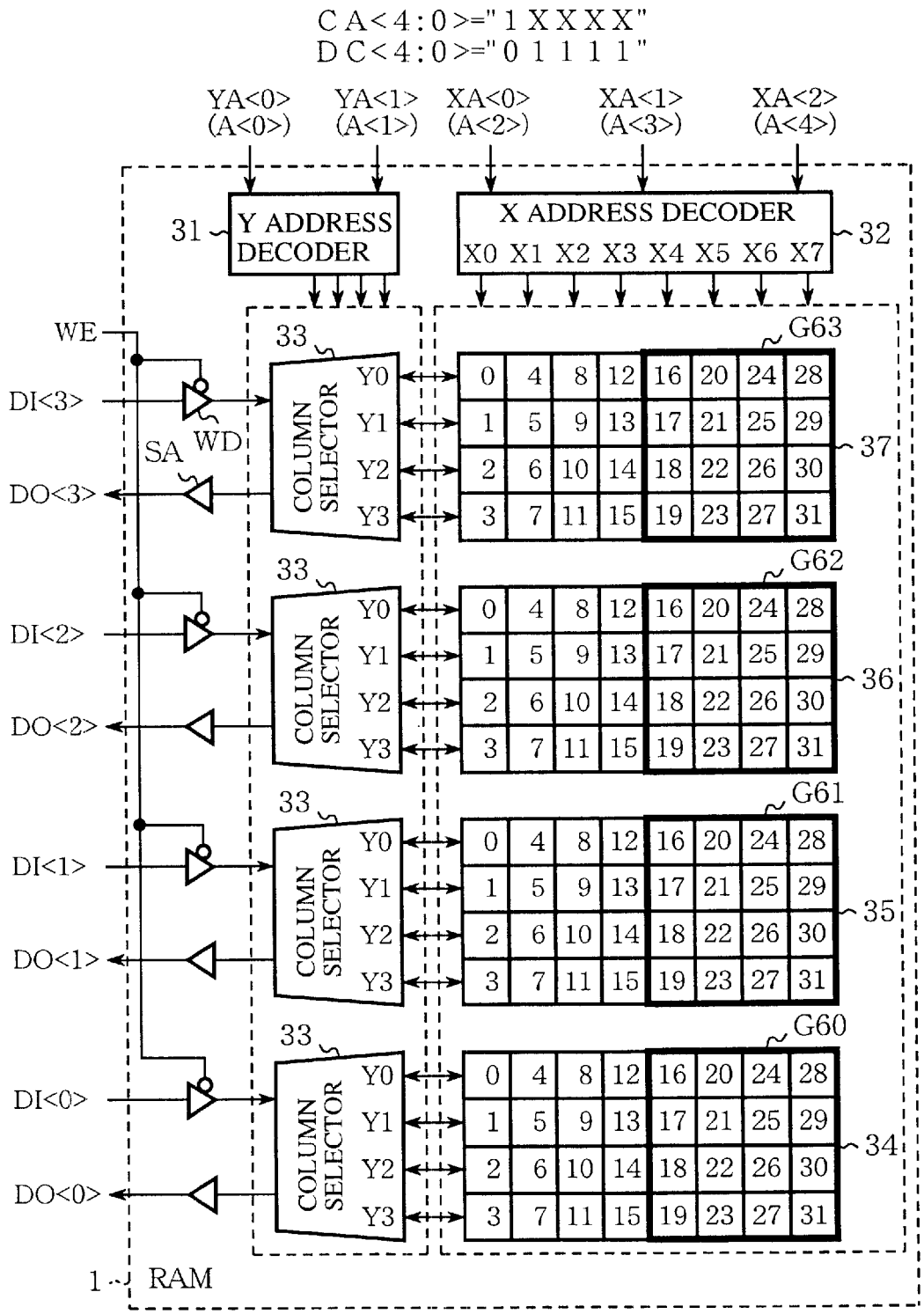
FIG. 9 is a block diagram showing memory cells in the memory cell groups selected in the RAM.

FIG. 9 is a block diagram showing each combination (G60, 61, 62 and 63) of selected memory cells in the memory cell groups in the RAM 1. In FIG. 9, each combination (G60, 61, 62 and 63) of the memory cell groups selected consists of the memory cells 16 to 31.

When the combination of the memory cells in each memory cell group indicated by the reference characters G60, G61, G62 and G63 depicted in FIG. 9 is selected as object memory cells that will be compared with expected values EXP, the self test controller (not shown) generates the control signals CA<4:0>1XXXX in binary notation (where "X" indicates both 0 and 1), DC<4:0>=01111 and CINV=0, and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 16 to 31 (whose number is the half of total number of the memory cells 1 through 31) addressed by the address signal XA<2>=1 (in binary notation). Since the comparison operation after the preceding operation is the same as that of the operation of the example shown in FIGS. 6 to 8, it is therefore omitted here.

In the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 16 to 31 in each memory cell group in the RAM 1. In this case, it is possible to perform the test whether or not there is a defective portion in the memory cells other than the specific memory cells 16 to 31.

Next, a description will be given of the selection operation to select another combination of the memory cells in the memory cell groups 34, 35, 36 and 37 in the RAM 1.

Figure 10:
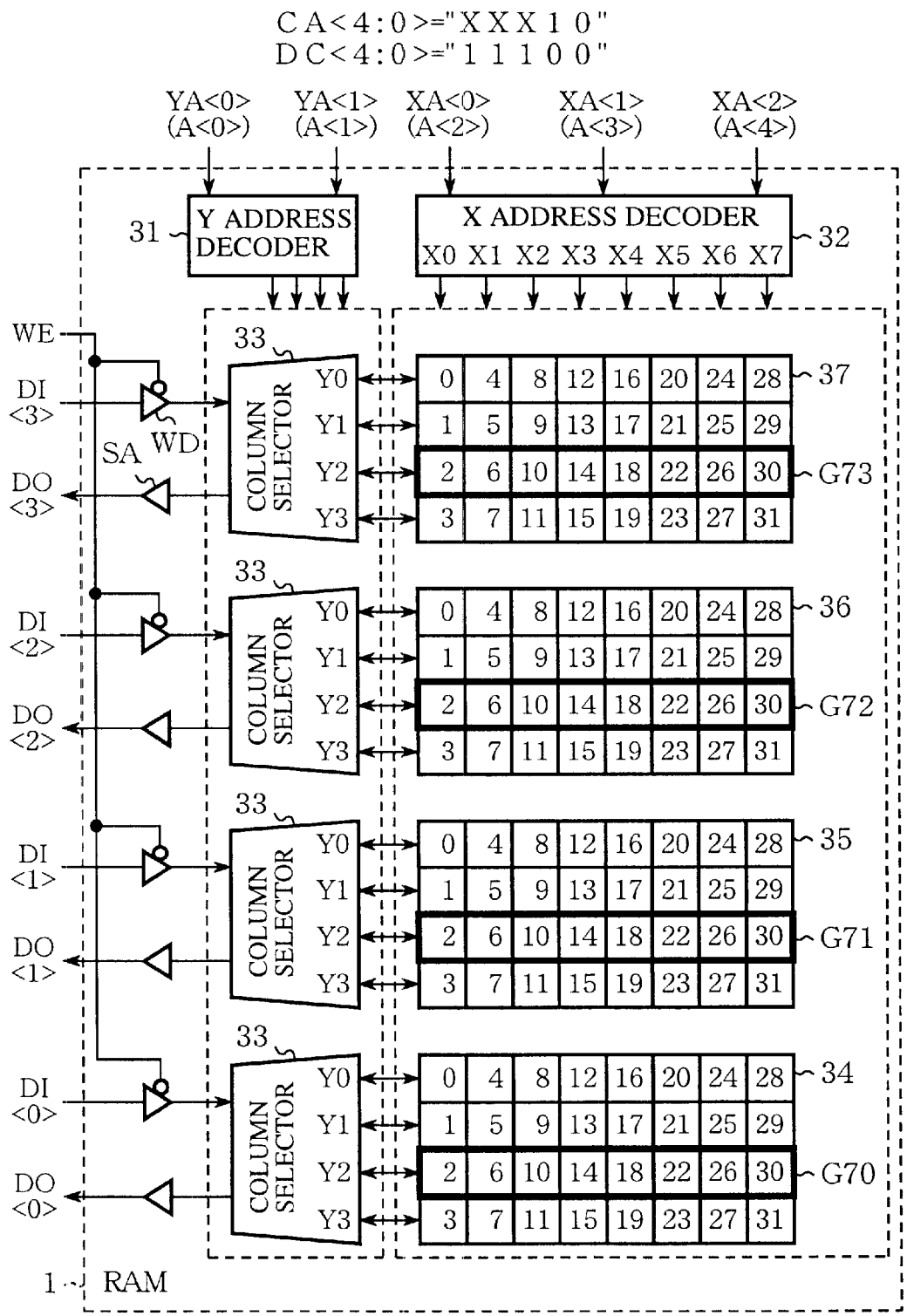
FIG. 10 is a block diagram showing memory cells in the memory cell groups selected in the RAM.

FIG. 10 is a block diagram showing each combination (G70, G71, G72 and G73) of selected memory cells in the memory cell groups 34, 35, 36 and 37 in the RAM 1.

When the combination of the memory cells in each memory cell group indicated by the reference characters G70, G71, G72 and G73 depicted in FIG. 10 is selected as object memory cells that will be compared with expected values EXP, the self test controller (not shown) generates the control signals CA<4:0>=XXX10 in binary notation (where "X" indicates both 0 and 1), DC<4:0>=11100 and CINV=0, and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 2, 6, 10, 14, 18, 22, 26 and 30 addressed by the address signal YA<1:0>=10 (in binary notation). Since the comparison operation after the preceding operation is the same as that of the operation of the example shown in FIGS.6 to 8, it is therefore omitted here.

In the state where the control signals CA< > and DC< >remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 2, 6, 10, 14, 18, 22, 26 and 30 in each memory cell group in the RAM 1. In this case, it is possible to perform the test whether or not there is a defective portion in the memory cells other than the specific memory cells 2, 6, 10, 14, 18, 22, 26 and 30.

Next, a description will be given of the selection operation to select another combination of the memory cells in the memory cell groups 34, 35, 36 and 37 in the RAM 1.

Figure 11:
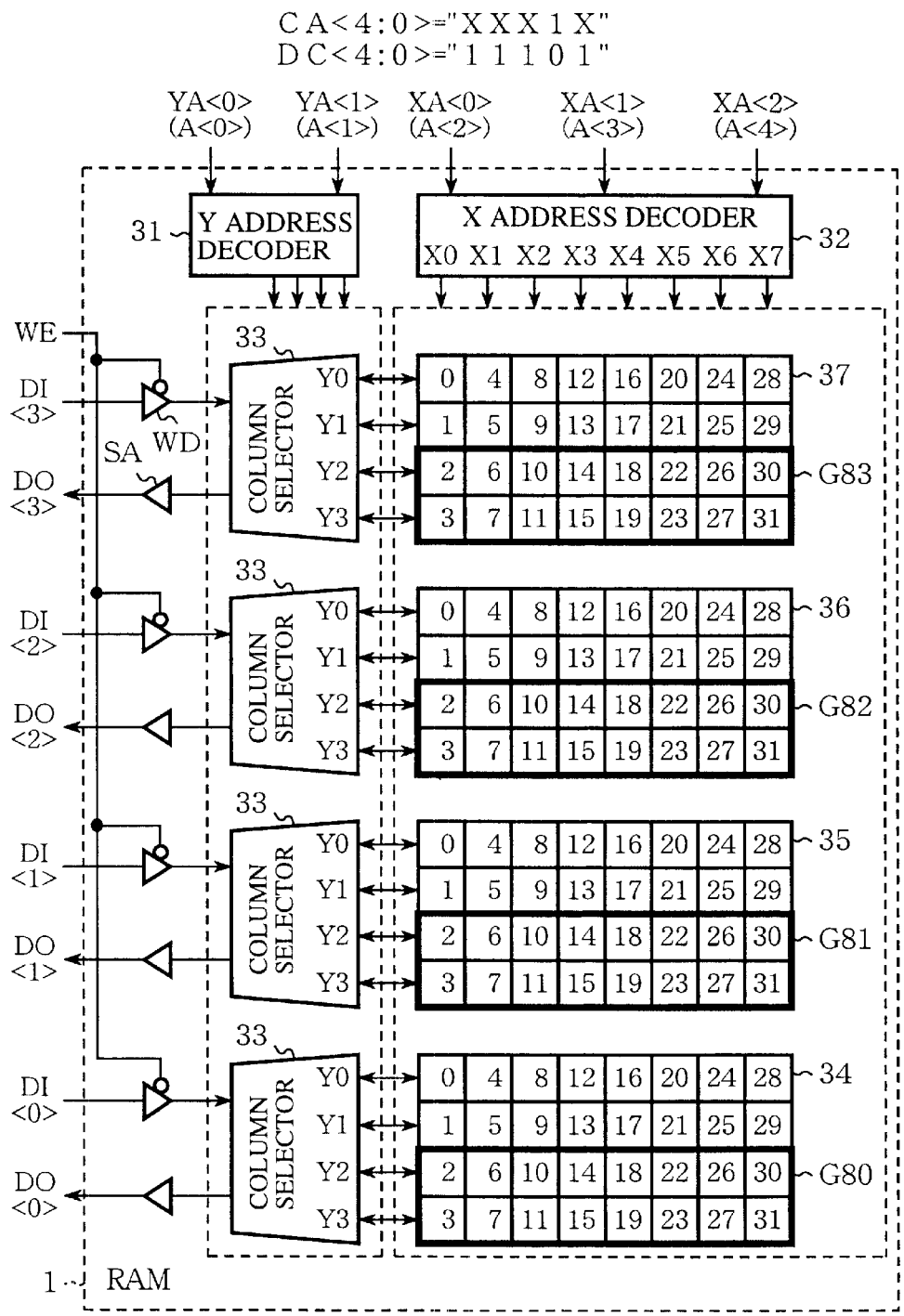
FIG. 11 is a block diagram showing memory cells in the memory cell groups selected in the RAM.

FIG. 11 is a block diagram showing each combination (G80, G81, G82 and G83) of selected memory cells in the memory cell groups 34, 35, 36 and 37 in the RAM 1. Each combination (G80, G81, G82 and G83) of the selected memory cells consists of a half of the total memory cells (the total number of the selected memory cells is 16) in each of the memory cell groups 34, 35, 36 and 37.

When the combination of the memory cells in each memory cell group indicated by the reference characters GB0, G81, G82 and G83 depicted in FIG. 11 is selected as object memory cells that will be compared with expected values EXP, the self test controller (not shown) generates the control signals CA<4:0>25=XXX1X in binary notation (where "X", indicates both 0 and 1), DC<4:0>=11101 and CINV=0, and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 2, 3, 6, 7, 10, 11, 14, 15, 18, 19, 22, 23, 26, 27, 30 and 31 specified by the address YA<1>=1 (in binary notation). Since the comparison operation after the preceding operation is the same as that of the operation of the example shown in FIGS. 6 to 8, it is therefore omitted here.

In the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 2, 3, 6, 7, 10, 11, 14, 15, 18, 19, 22, 23, 26, 27, 30 and 31 in each memory cell group in the RAM 1. In this case, it is possible to perform the test whether or not there is a defective portion in the memory cells other than the specific memory cells 2, 3, 6, 7, 10, 11, 14, 15, 18, 19, 22, 23, 26, 27, 30 and 31.

Next, a description will be given of the selection operation to select another combination of the memory cells in the memory cell groups 34, 35, 36 and 37 in the RAM 1.

Figure 12:
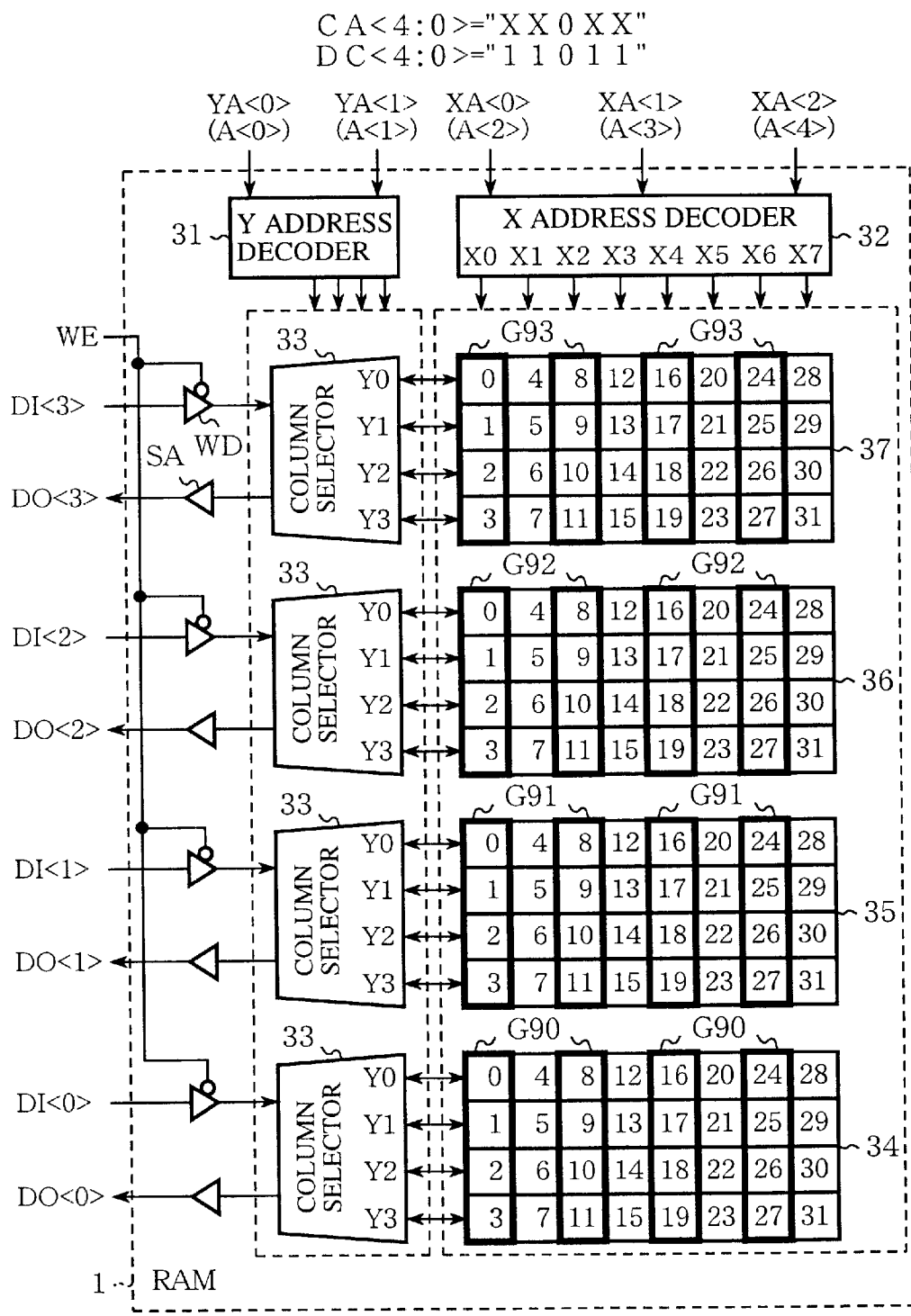
FIG. 12 is a block diagram showing memory cells in the memory cell groups selected in the RAM.

FIG. 12 is a block diagram showing each combination (G90, G91, G92 and G93) of selected memory cells in the memory cell groups 34, 35, 36 and 37 in the RAM 1. Each combination (G90, G91, G92 and G93) of the selected memory cells consists of a half of the total memory cells (the total number of the selected memory cells shown by striped shape in FIG. 12 is 16) in each of the memory cell groups 34, 35, 36 and 37.

When the combination of the memory cells in each memory cell group indicated by the reference characters G90, G91, G92 and G93 depicted in FIG. 12 is selected as object memory cells that will be compared with expected values EXP, the self test controller (not shown) generates the control signals CA<4:0>=XX0XX in binary notation (where "X" indicates both 0 and 1), DC<4:0>=11011 and CINV=0, and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 0–3, 8–11, 16–19 and 24–27 indicated by striped shape (G90, G91, G92 and G93) in each memory cell group shown in FIG. 12 and specified by the address XA<0>=1 (in binary notation). Since the comparison operation after the preceding operation is the same as that of the operation of the example shown in FIGS. 6 to 8, it is therefore omitted here. Accordingly, if no fault is detected by the above manner, it may be diagnosed that the word line indicated by the address XA<0>=1 has no defective portion.

In the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 0–3, 8–11, 16–19 and 24–27 in each memory cell group in the RAM 1. In this case, it is possible to perform the test whether or not there is a defective portion in the memory cells other than the specific memory cells 0–3, 8–11, 16–19 and 24–27.

Next, a description will be given of the selection operation to select another combination of the memory cells in the memory cell groups 34, 35, 36 and 37 in the RAM 1.

Figure 13:
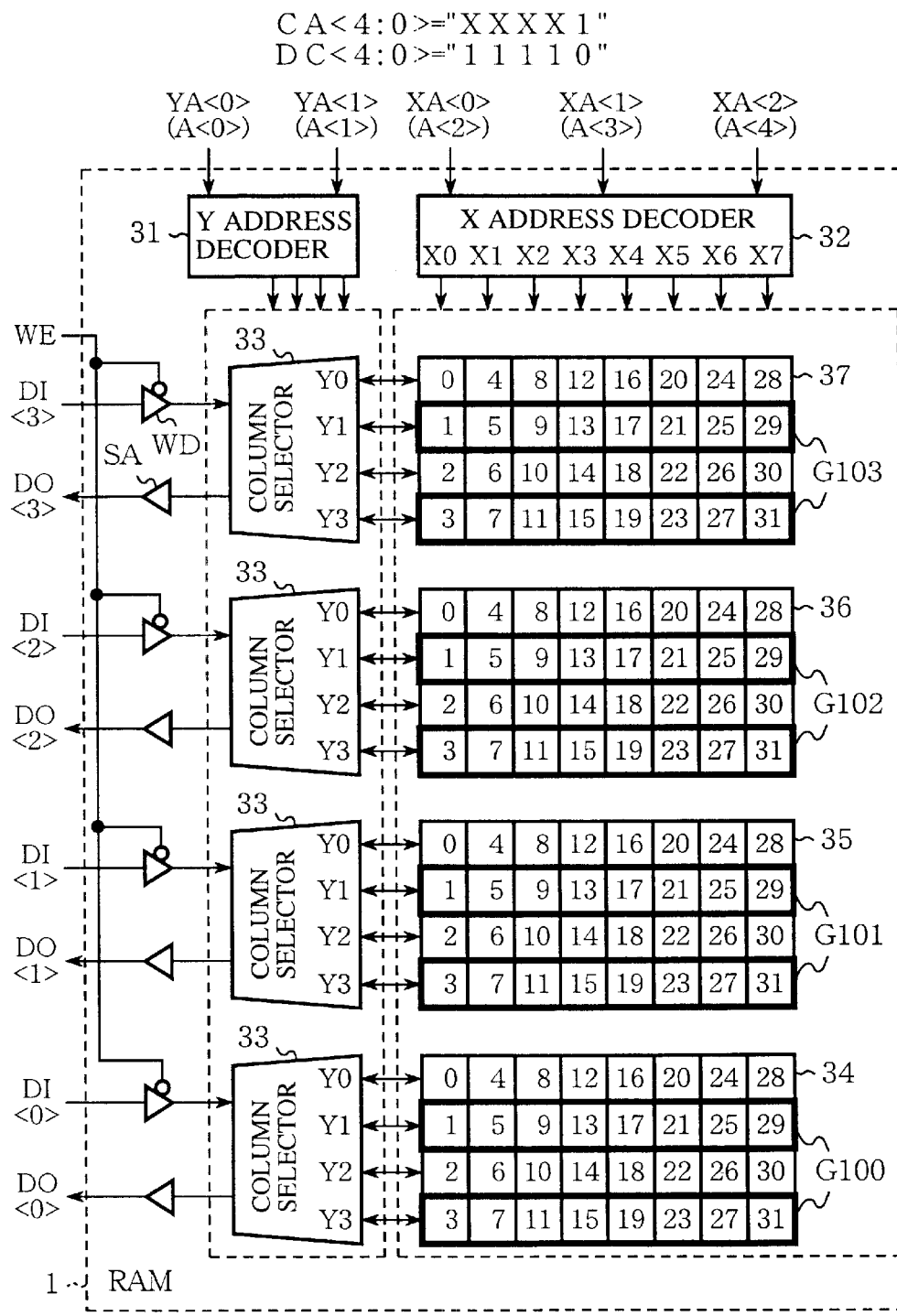
FIG. 13 is a block diagram showing memory cells in the memory cell groups selected in the RAM.

FIG. 13 is a block diagram showing each combination (G100, G101, G102 and G103) of selected memory cells in the memory cell groups 34, 35, 36 and 37 in the RAM 1. Each combination (G100, G101, G102 and G103) of the selected memory cells (1, 5, 9, 13, 17, 21, 25 and 29, and 3, 7, 11, 15, 19, 23, 27 and 31 ) consists of a half of the total memory cells (the total number of the selected memory cells shown by striped shape in FIG. 13 is 16) in each of the memory cell groups 34, 35, 36 and 37.

When the combination of the memory cells in each memory cell group indicated by the reference characters G100, G101, G102 and G103 depicted in FIG. 13 is selected as object memory cells that will be compared with expected values EXP, the self test controller (not shown) generates the control signals CA<4:0>=XXXX1 in binary notation (where "X" indicates both 0 and 1), DC<4:0>=11110 and CINV=0, and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 1, 5, 9, 13, 17, 21, 25 and 29, and 3, 7, 11, 15, 19, 23, 27 and 31 indicated by striped shape (G100, G101, G102 and G103) in each memory cell group shown in FIG. 13 and specified by the address YA<0>=1 (in binary notation). Since the comparison operation after the preceding operation is the same as that of the operation of the example shown in FIGS. 6 to 8, it is therefore omitted here. Accordingly, if no fault is detected by the above manner, it may be diagnosed that the bit line indicated by the address YA<0>=1 has no defective portion.

In the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 1, 5, 9, 13, 17, 21, 25 and 29, and 3, 7, 11, 15, 19, 23, 27 and 31 in each memory cell group in the RAM 1. In this case, it is possible to perform the test whether or not there is a defective portion in the memory cells other than the specific memory cells 1, 5, 9, 13, 17, 21, 25 and 29, and 3, 7, 11, 15, 19, 23, 27 and 31.

The previous explanation has described the cases of the RAM 1 of 32 words and 4 bits. However, the present invention is not limited by these cases, for example, the present invention may be applied to various memory cells having other configurations in word number and bit number.

As described above, according to the first embodiment, based on the control signals CA< >, DC< >, CMP and other control signals provided from the self test controller (not shown), the comparison control circuit 6 selects a combination of memory cells in each memory cell group and then provides the comparison control signal CCMP to the scan flip flops (SFF) 2, 3, 4 and 5 only when the input address indicates a memory cell in the selected combination. Accordingly, it is possible to perform the diagnosis to various faults such as fault of a specified memory cell (fault of a single bit), fault of a bit line, fault of a word line, and the like.

Second Embodiment

Figure 14:
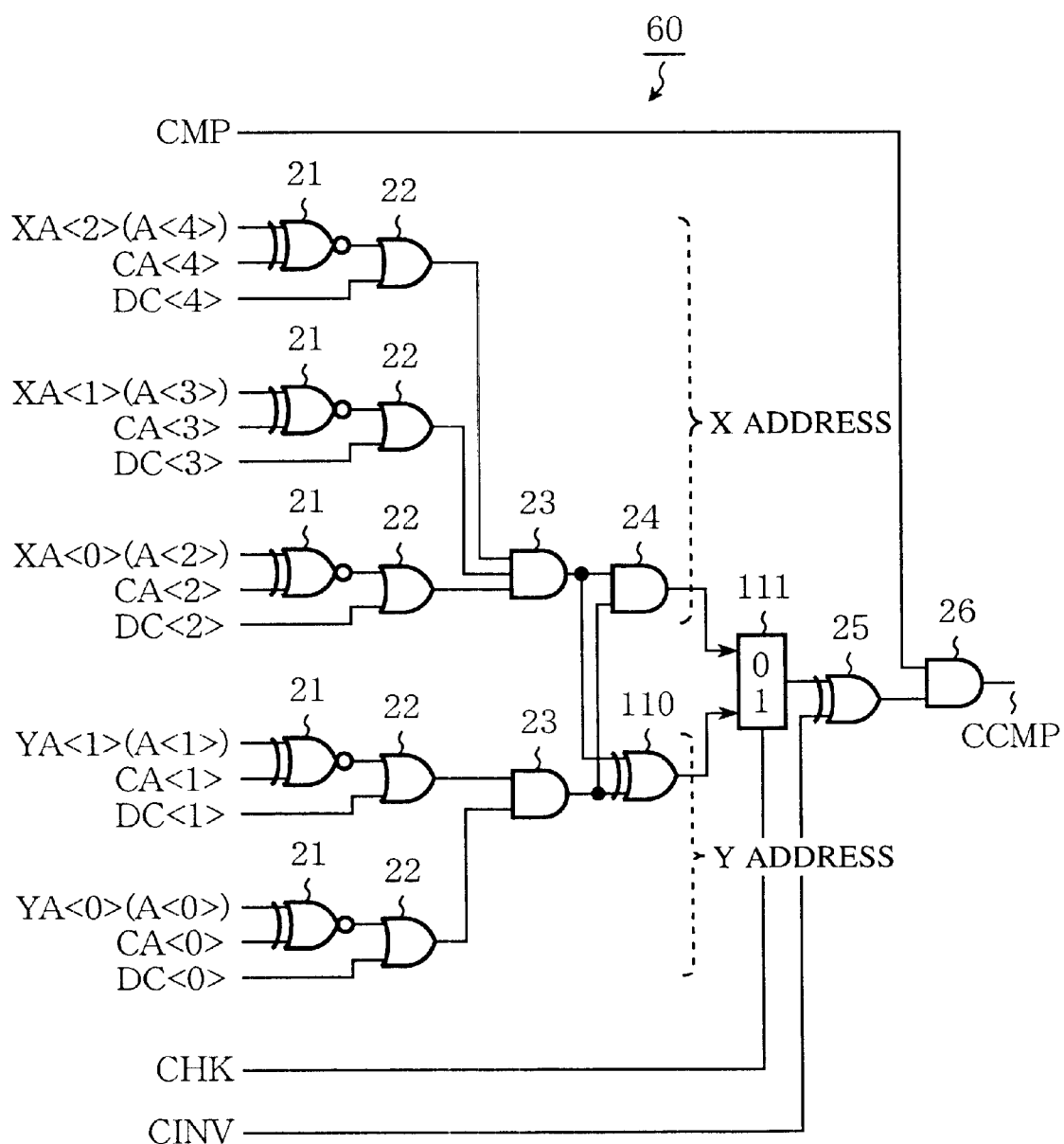
FIG. 14 is a block diagram showing a comparison control circuit incorporated in a semiconductor integrated circuit device with fault analysis function according to the second embodiment of the present invention.
Figure 16:
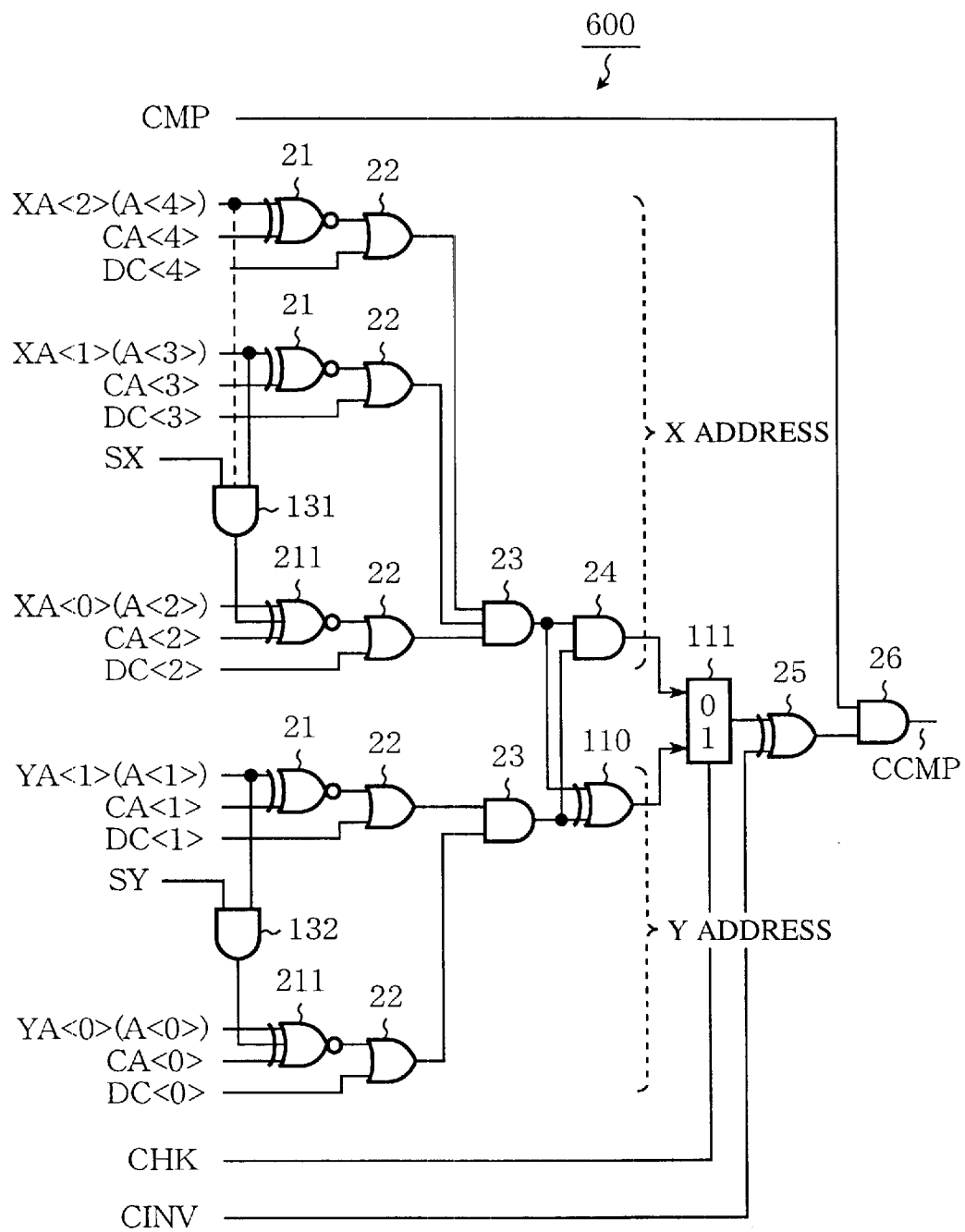
FIG. 16 is a circuit diagram showing a configuration of a comparison control circuit a semiconductor integrated circuit device with fault analysis function according to the third embodiment of the present invention.

FIG. 14 is a block diagram showing a comparison control circuit in a semiconductor integrated circuit device with fault analysis function according to the second embodiment of the present invention. In FIG. 16, the reference number 60 designates a comparison control circuit, and 110 denotes a XOR circuit to perform XOR operation between the results of logical arithmetic operations for x address and Y address. The reference number 111 indicates a gate that selects one of the output from the XOR circuit 110 and the output from the AND circuit 24. Other components in the semiconductor integrated circuit device of the second embodiment are the same as those of the first embodiment shown in FIG. 4, and therefore the explanation of the same components is omitted here.

Next, a description will be given of the operation of the second embodiment.

The comparison control circuit 60 shown in FIG. 14 performs the same operation of the comparison control circuit 6 in the first embodiment shown in FIG. 5 when receiving the control signal CHK of zero (CHK=0) generated by and then transferred from the self test controller (not shown). When the value of the control signal CHK is one (CHK=1), the XOR circuit 110 in the comparison control circuit 60 performs XOR operation between results of both logical arithmetic operations for X address and Y address output from the AND circuits 23 that are arranged corresponding to the X address and the Y address. The output from the XOR circuit 110 is then selected by the gate 111 only when CHK=1.

Next, the XOR circuit 25 performs XOR operation between the arithmetic result selected by the gate 111 and the value of the control signal CINV. The AND circuit 26 performs AND operation between the result of XOR operation output from the XOR circuit 25 and the control signal CMP. The comparison control circuit 60 then transfers this result of AND operation by the AND circuit 26 to the scan flip flops (SFF) 2, 3, 4 and as the comparison control signal CCMP.

Figure 15:
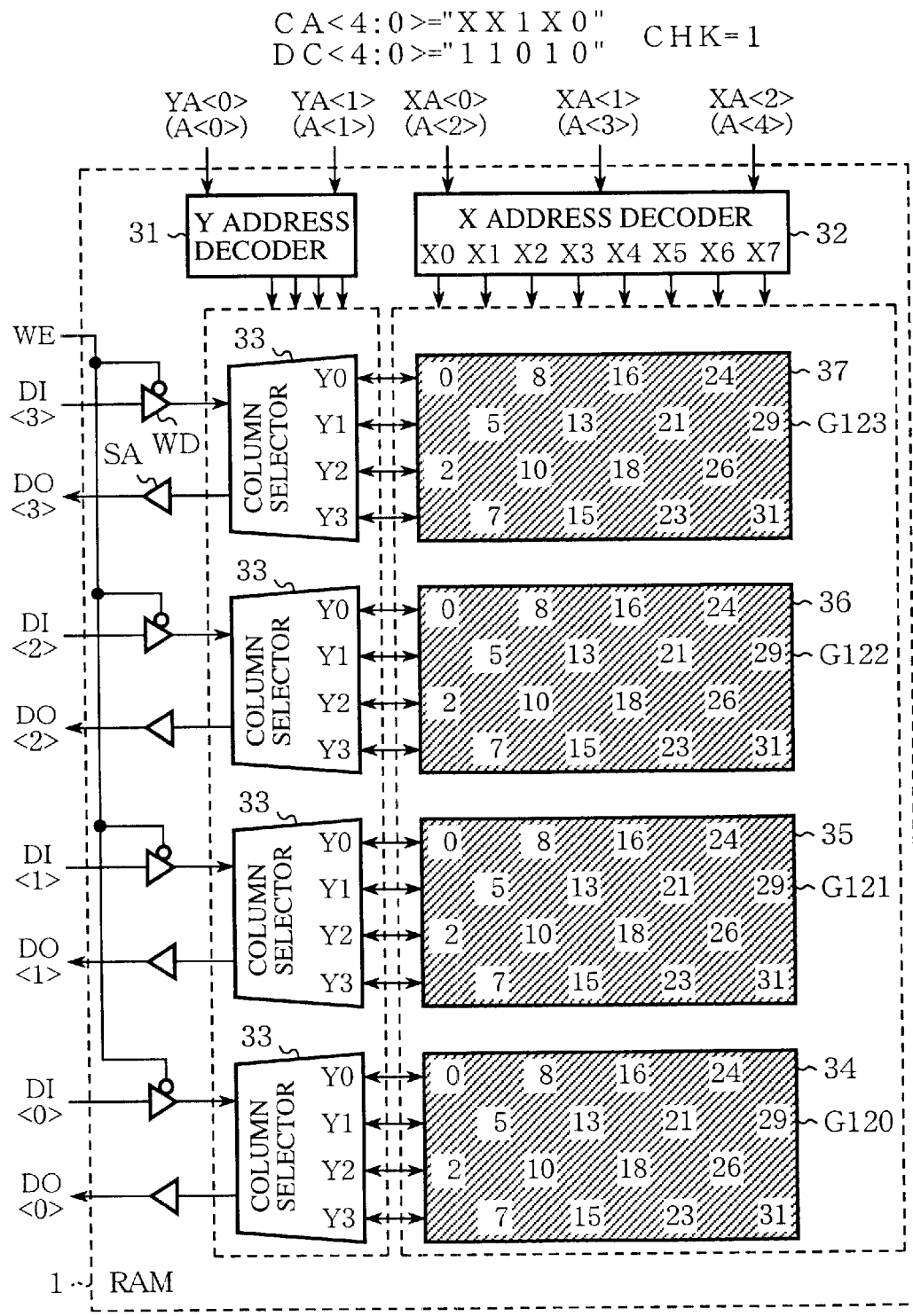
FIG. 15 is a block diagram showing a configuration of a RAM in the semiconductor integrated circuit shown in FIG. 14.

FIG. 15 is a block diagram showing a combination of selected memory cells in each memory cell group 34, 35, 36 and 37 in the RAM 1 incorporated in the semiconductor integrated circuit shown in FIG. 14.

When the combination of the memory cells in each memory 10 cell group shown by a lattice shape indicated by the reference characters G120, G121, G122 and G123 depicted in FIG. 15 is selected as object memory cells that will be compared with expected values EXP, the self test controller (not shown) generates the control signals CA<4:0>=XX1X0 in binary notation (where "X", indicates both 0 and 1), DC<4:0>=11010, CHK=1 and CINV=0 and then outputs them to the comparison control circuit 6.

The comparison control circuit 6 outputs to the scan flip flops (SFF) 2, 3, 4 and 5 the comparison control signal CCMP indicating the initiation of the comparison operation only for the memory cells 0, 2, 5, 7, 8, 10, 13, 15, 16, 18, 21, 23, 24, 26, 29 and 31. Since the comparison operation after the preceding operation is the same as that of the operation of the example shown in FIGS. 6 to 8, it is therefore omitted here.

Next, the self test controller (not shown) generates a control signal/CINV that is obtained by inverting the control signal CINV in level and then provides the inverted control signal/CINV to the comparison control circuit 6 in order to perform the comparison operation only for all of the memory cells other than the memory cells 0, 2, 5, 7, 8, 10, 13, 15, 16, 18, 21, 23, 24, 26, 29 and 31.

As a result, it is possible to detect that there is a bit fault of one or more memory cells and no fault of a word line and a bit line if the fault is detected under CINV=1 and not detected under CINV=0. That is, because the fault of a word line and a bit line is a fault of wiring, this includes a fault of adjacent bits (memory cells). Accordingly, it is diagnosed that there is a fault in both the cases CINV=0 and CINV=1. In other word, when there is a fault under only one of the both cases CINV=0 and CINV=1, it may be diagnosed that the fault is not the fault of a word line or a bit line.

However, the present invention is not limited by this embodiment where the RAM 1 has the configuration of 32 words×4 bits, for example, the present invention may be applied to memory circuits having other configurations of different word number and bit number.

As described above, according to the second embodiment, the XOR circuit 100 and the gate circuit 111 are incorporated. The XOR circuit 100 is capable of performing XOR operation between the arithmetic results of X address and Y address. Thereby, based on the control signals CA< >, DC< >, CMP and other control signals provided from the self test controller (not shown), the comparison control circuit 6 may select a combination of memory cells in each memory cell group in the RAM 1 and then provides the comparison control signal CCMP to the scan flip flops (SFF) 2, 3, 4 and 5 only when an input address indicates a memory cell in the selected combination. Accordingly, it is possible to perform a diagnosis of various faults such as fault of a specified memory cell (fault of a single bit), fault of a bit line, fault of a word line, and the like.

Third Embodiment

FIG. 16 is a circuit diagram showing a configuration of a comparison control circuit in a semiconductor integrated circuit device with fault analysis function according to the third embodiment of the present invention. In FIG. 16, the reference number 600 designates the comparison control circuit, 131 and 132 denote AND circuits that input control signals SX and SY (that will be explained later) are arranged according to X address and Y address. The reference character CHK indicates a control signal generated by the self test controller (not shown) and then supplied to the comparison control circuit 600. The reference number 211 denotes NXOR circuits of three inputs, each NXOR circuit is arranged corresponding to X address and Y address, respectively. Each of these NXOR circuits has the same function of the NXOR circuit 21 shown in FIG. 14 other than the function to input the output from each of the AND circuits 131 and 132. Other components in the comparison control circuit 600 of the third embodiment shown in FIG. 16 is the same as those of the comparison control circuit 60 shown in FIG. 14, and therefore the explanation for the same components is omitted here.

Next, a description will be given of the operation of the third embodiment.

When SX=0 and SY=0, the comparison control circuit 600 shown in FIG. 16 performs the same operation of the comparison control circuit 60 shown in FIG. 14.

The logical arithmetic operation by the XNOR circuit 21, the OR circuit 22, the AND circuit 23 for X address and Y address is the same as that by the comparison control circuit 60 in the second embodiment shown in FIG. 14.

Next, the XOR circuit 110 performs XOR operation between the comparison result in X and Y addresses and outputs the operation result to the gate circuit 111. The gate circuit 111 selects the operation result only when CHK=1. Then, the XOR circuit 25 performs XOR operation between the operation result from the gate circuit 111 and the value of the control signal CINV. The AND circuit 26 then performs AND operation between the result of the XOR operation and the value of the control signal. The result of the AND operation output from the AND circuit 26 is provided to the scan flip flops (SFF) 2, 3, 4 and 5 as the comparison control signal CCMP.

Figure 17:
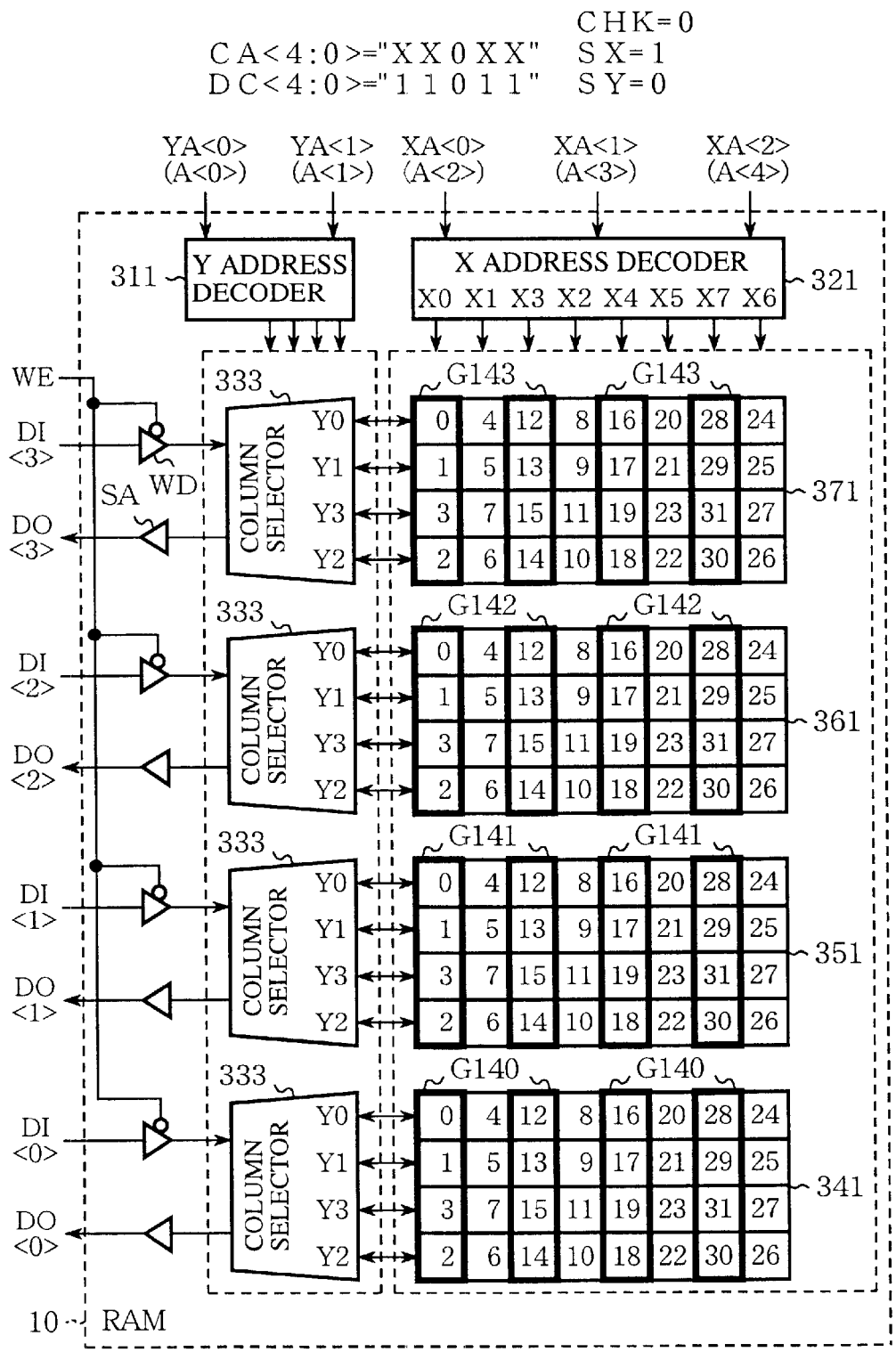
FIG. 17 is a block diagram showing the configuration of the RAM incorporated in the semiconductor integrated circuit shown in FIG. 16.

FIG. 17 is a block diagram showing a combination (G140, G141, G142 and G143) of selected memory cells in each of memory cell groups in a RAM 10 in the semiconductor integrated circuit with fault analysis function shown in FIG. 16. In FIG. 17, the reference number 10 designates the RAM in which memory cells are placed in scrambled arrangement. The reference number 311 designates a Y address decoder, 321 indicates X address decoder, and 333 denotes each column selector. The reference numbers 341, 351, 361 and 371 denote memory cell groups in the RAM 10.

For example, when the fault analysis for the memory cells as object memory cells (that are compared with expected values EXP, whose X addresses in the RAM 10 are scrambled) is performed, the control signal SX is set to 1 (SX=1).

When the combination of the memory cells in each memory cell group indicated by the reference characters G140, G141, G142 and G143 depicted in FIG. 17 is selected as the object memory cells that will be compared with expected values EXP, the self test controller (not shown) generates the control signals CA<4:0>=XX0XX in binary notation (where "X" indicates both 0 and 1), DC<4:0>=11011, CHK=0 and CINV=0, and then outputs them to the comparison control circuit 600.

As a result, the comparator control circuit outputs to the scan flip flops 2, 3, 4 and 5 the comparison control signal CCMP that indicates the initiation of the comparison operation only for the combination (G140, G141, G142 and G143) of the memory cells 0–3, 12–15, 16–19 and 28–31 in each memory cell group (341, 351, 361 and 371) indicated by striped shape in the RAM 10. Each combination (G140, G141, G142 and G143) of the selected memory cells consists of a half of the total memory cells (the total number of the selected memory cells shown by striped shape in FIG. 17 is 16) in each of the memory cell groups 34, 35, 36 and 37. Since the comparison operation after the preceding operation is the same as that of the operation of the example shown in FIGS. 6 to 8, it is therefore omitted here.

As described above, it is possible to perform the fault analysis for the RAM 10 by selecting the memory cells 0–3, 12–15, 16–19 and 28–31 (a half of the total memory cells in each memory cell group) indicated by the striped shape (where X addresses are scrambled, that is to say, these memory cells are placed in scrambled arrangement), like the combination (G90, G91, G92 and G93) of the memory cells indicated by the striped shape in the RAM 1 shown in FIG. 12.

Furthermore, in the situation where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 0–3, 12–15, 16–19 and 28–31 in each memory cell group in the RAM 10.

Next, a description will be given of the selection operation to select another combination of the memory cells in the memory cell groups 341, 351, 361 and 371 in the RAM 10.

Figure 18:
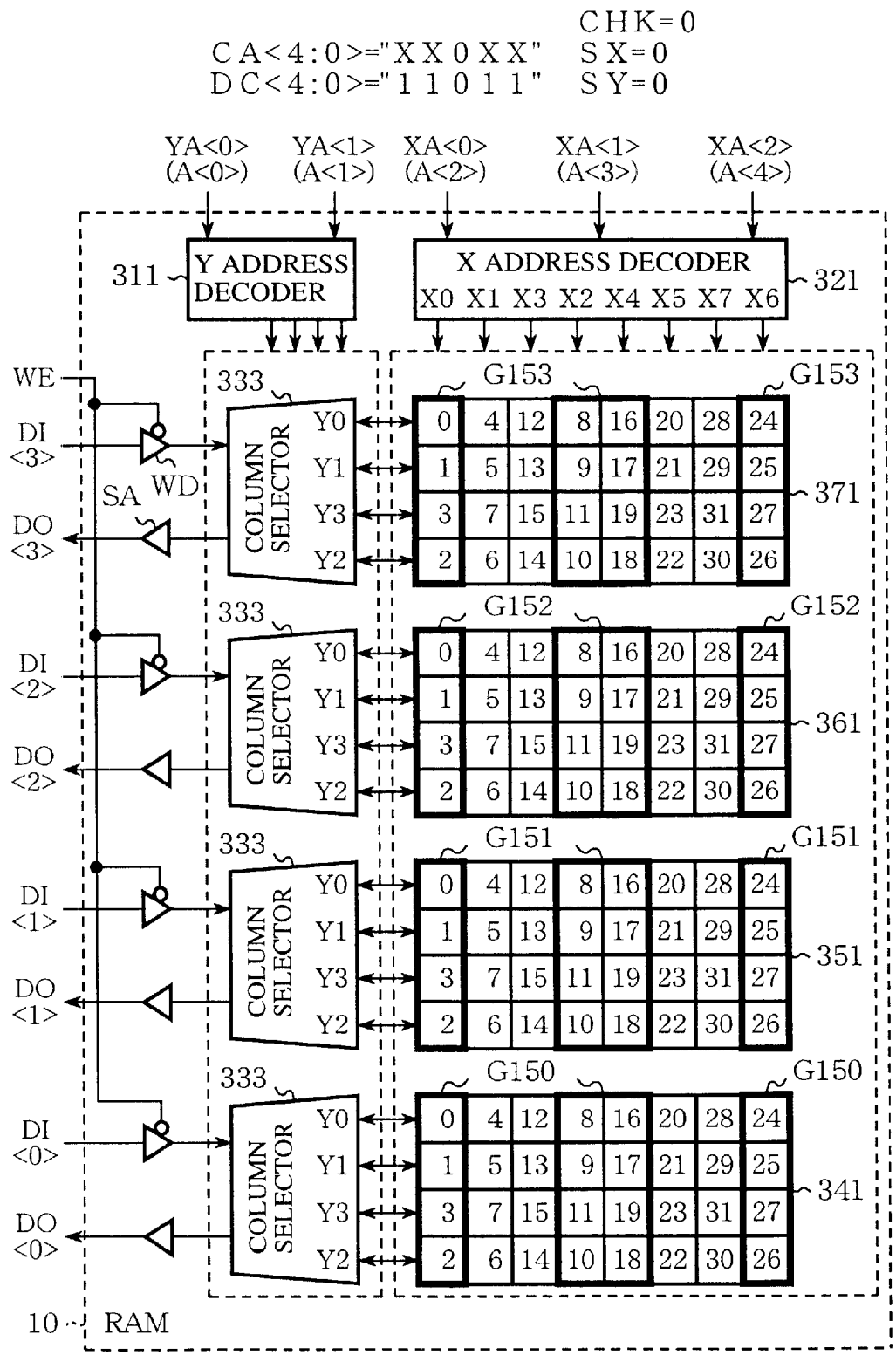
FIG. 18 is a block diagram showing memory cells in the memory cell groups selected in the RAM.

FIG. 18 is a block diagram showing another combination (G150, G151, G152 and G153) of selected memory cells in the memory cell groups 341, 351, 361 and 371 in the RAM 10. The memory cells are placed in scrambled arrangement, that is to say, the x addresses of the memory cells in the RAM 10 are scrambled.

For example, when the combination of the memory cells in each memory cell group (341, 351, 361 and 371) indicated by the reference characters G150, G151, G152 and G153 depicted in FIG. 18 is selected as the object memory cells that will be compared with expected values EXP, the self test controller (not shown) generates the control signals SX=0, SY=0, CA<4:0>=XX0XX in binary notation (where "X" indicates both 0 and 1), DC<4:0>=11011, CHK=0 and CINV=0, and then outputs them to the comparison control circuit 600.

As a result, the comparison control circuit 600 outputs to the scan flip flops 2, 3, 4 and 5 the comparison control signal CCMP that indicates the initiation of the comparison operation only for the combination (G150, G151, G152 and G153) of the memory cells 0–3, 8–11, 16–19 and 24–27 in each memory cell group (341, 351, 361 and 371) indicated by striped shape in the RAM 10. The memory cells 0–3, 8–11, 16–19 and 24–27 correspond to two word lines in the RAM 10.

Since the comparison operation after the preceding operation is the same as that of the operation of the example shown in FIGS. 6 to 8, it is therefore omitted here.

As described above, it is possible to perform the fault analysis for the RAM 10 by selecting the memory cells indicated by the striped shape where X addresses are scrambled, that is to say, these memory cells are placed in scrambled arrangement.

Furthermore, in the state where the control signals CA< > and DC< > remain at the same values described above, when the self test controller (not shown) generates and provides the control signal CINV of 1 (CINV=1) to the comparison control circuit 6, the scan flip flops (SFF) 2, 3, 4 and 5 may perform the comparison operation to all of the memory cells other than the memory cells 0–3, 8–11, 16–19 and 24–27 in each memory cell group in the RAM 10.

Next, a description will be given of the selection operation to select another combination of the memory cells in the memory cell groups 341, 351, 361 and 371 in the RAM 10.

Figure 19:
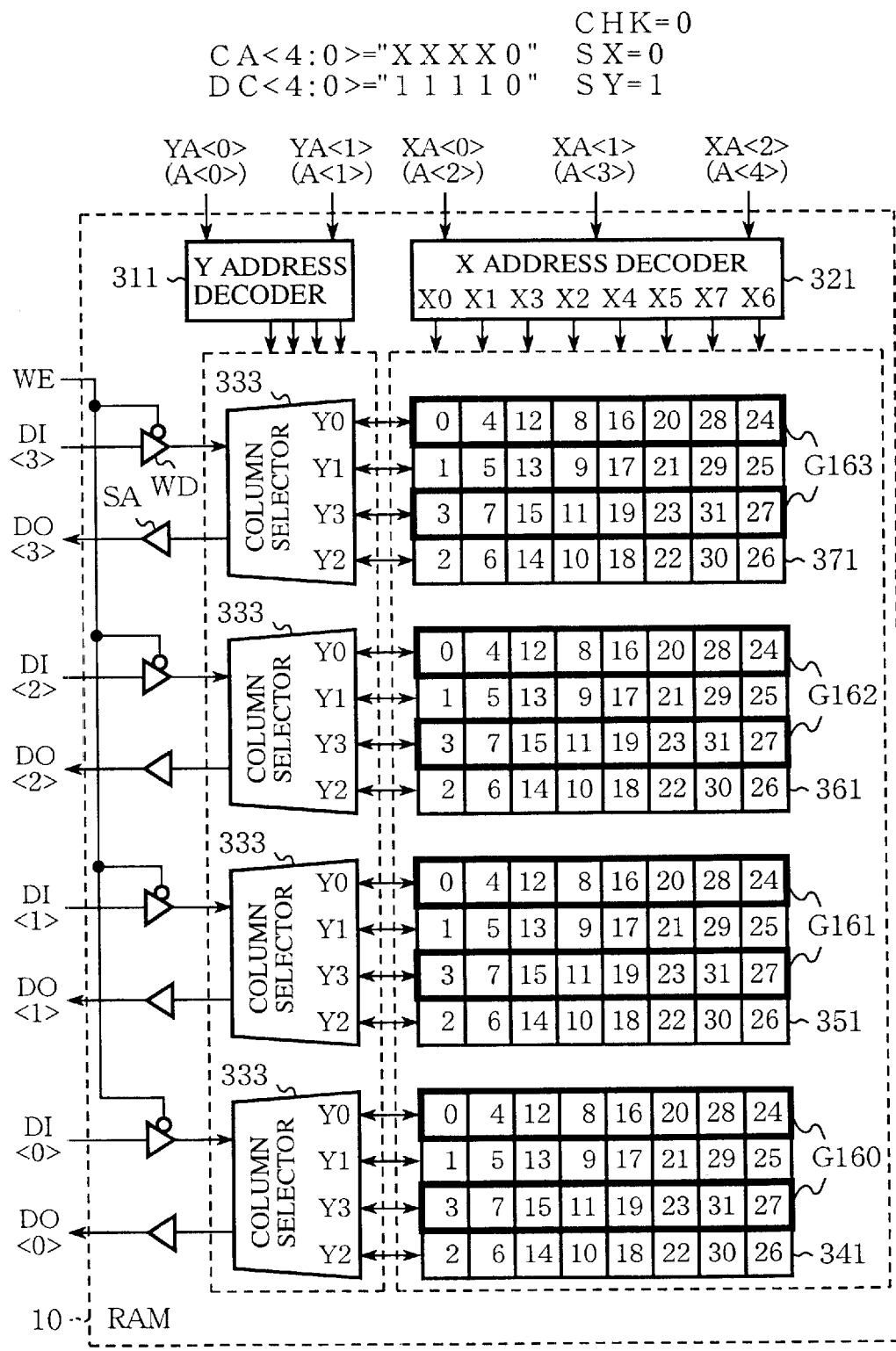
FIG. 19 is a block diagram showing memory cells in the memory cell groups selected in the RAM.

FIG. 19 is a block diagram showing another combination (G160, G161, G162 and G163) of selected memory cells in the memory cell groups 341, 351, 361 and 371 in the RAM 10.

For example, when the combination of the memory cells in each memory cell group (341, 351, 361 and 371) indicated by the reference characters G160, G161, G162 and G163 depicted in FIG. 19 is selected as the object memory cells that will be compared with expected values EXP, the self test controller (not shown) generates the control signals SX=0, SY=1, CA<4:0>=XXXX0 in binary notation (where "X" indicates both 0 and 1), DC<4:0>=11110, CHK=0 and CINV=0, and then outputs them to the comparison control circuit 600.

As a result, the comparison control circuit 600 outputs to the scan flip flops 2, 3, 4 and 5 the comparison control signal CCMP that indicates the initiation of the comparison operation only for the combination (G160, G161, G162 and G163) of the memory cells 0, 4, 12, 8, 16, 20, 28, 24 and 3, 7, 15, 11, 19, 23, 31 and 27 in each memory cell group (341, 351, 361 and 371).

The number of the selected memory cells 0, 4, 12, 8, 16, 20, 28, 24 and 3, 7, 15, 11, 19, 23, 31 and 27 indicated by striped shape in RAM 10 (where Y addresses (Y0, Y1, Y3 and Y2 in order) are scrambled) is a half of the total number of the memory cells in each memory cell group.

Since the comparison operation after the preceding operation is the same as that of the operation of the example shown in FIGS. 6 to 8, it is therefore omitted here.

Furthermore, in the state where the control signals CA< > and DC< > remain at the same values described above, when the self test controller (not shown) generates and provides the control signal CINV of 1 (CINV=1) to the comparison control circuit 600, the scan flip flops (SFF) 2, 3, 4 and 5 may perform the comparison operation to all of the memory cells other than the memory cells 0, 4, 12, 8, 16, 20, 28, 24 and 3, 7, 15, 11, 19, 23, 31 and 27 in each memory cell group in the RAM 10.

Next, a description will be given of the selection operation to select another combination of the memory cells in the memory cell groups 341, 351, 361 and 371 in the RAM 100.

Figure 20:
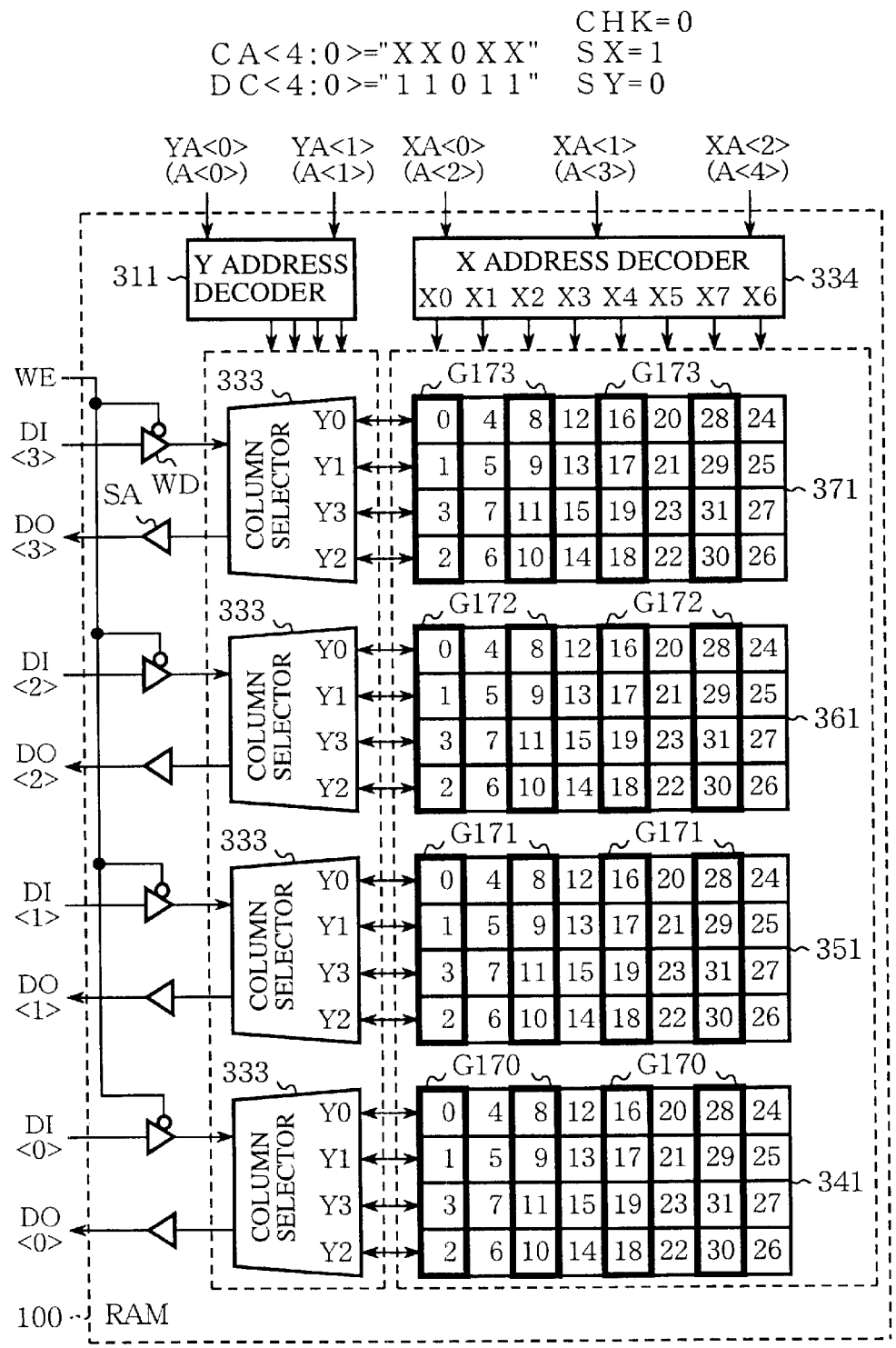
FIG. 20 is a block diagram showing memory cells in the memory cell groups selected in the RAM.

FIG. 20 is a block diagram showing another combination (G170, G171, G172 and G173) of selected memory cells in the memory cell groups 341, 351, 361 and 371 in the RAM 100. In FIG. 20, the reference number 334 designates a X address decoder for the RAM 100 in which X addresses (X0, X1, X2, X3, X4, X5, X7 and X6 in order) of the memory cells are scrambled.

For example, when the combination of the memory cells in each memory cell group (341, 351, 361 and 371) indicated by the reference characters G170, G171, G172 and G173 depicted in FIG. 20 is selected as the object memory cells that will be compared with expected values EXP, the self test controller (not shown) generates the control signals SX=1, SY=0, CA<4:0>=XX0XX in binary notation (where "X" indicates both 0 and 1), DC<4:0>=11011, CHK=0 and CINV=0, and then outputs them to the comparison control circuit 600.

As a result, the comparison control circuit 600 outputs to the scan flip flops 2, 3, 4 and 5 the comparison control signal CCMP that indicates the initiation of the comparison operation only for the combination (G170, G171, G172 and G173) of the memory cells 0–3, 8–11, 16–19 and 28–31 in each memory cell group (341, 351, 361 and 371) indicated by striped shape in the RAM 100. The memory cells 0–3, 8–11, 16–19 and 28–31 are placed in scrambled arrangement, that is to say, the X addresses of these memory cells are scrambled.

Since the comparison operation after the preceding operation is the same as that of the operation of the example shown in FIGS. 6 to 8, it is therefore omitted here.

The previous explanation describes the cases of the RAM 10 and the RAM 100 having the configuration of 32 words×4 bits. However, the present invention is not limited by these cases, for example, the present invention may be applied to memory circuits having other configurations having different word number and bit number.

Furthermore, in the state where the control signals CA< > and DC< > remain at the same values described above, when the self test controller (not shown) generates and provides the control signal CINV of 1 (CINV=1) to the comparison control circuit 600, the scan flip flops (SFF) 2, 3, 4 and 5 may perform the comparison operation to all of the memory cells other than the memory cells 0–3, 8–11, 16–19 and 28–31 in each memory cell group in the RAM 100.

As described above, according to the third embodiment, because the comparison control circuit 600 includes the AND circuits 131 and 132 for performing AND operation using the control signals SX and SY, respectively, based on the control signals CA< >, DC< >, SX, SY, CMP and other control signals provided from the self test controller (not shown), the comparison control circuit 600 selects a combination of memory cells in each memory cell group in the RAM 10 or the RAM 100 (in which X addresses or Y addresses are scrambled) and then provides the comparison control signal CCMP to the scan flip flops (SFF) 2, 3, 4 and 5 only when an address indicates a memory cell in the selected combination. Accordingly, it is possible to perform a diagnosis for various faults such as fault of a specified memory cell (fault of a single bit), fault of a bit line, fault of a word line, and the like.

Fourth Embodiment

Figure 21:
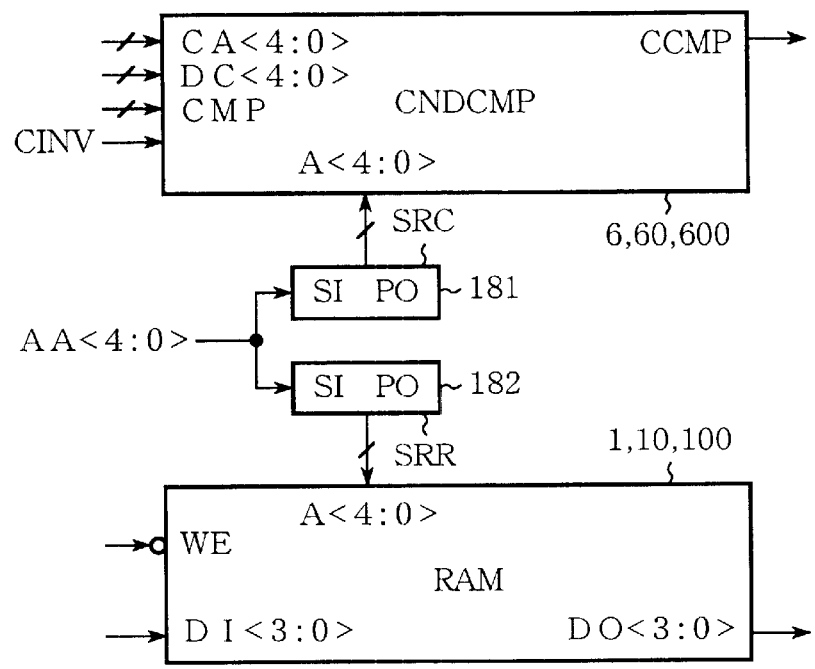
FIG. 21 is a block diagram showing a configuration of a semiconductor integrated circuit device with fault analysis function according to the fourth embodiment of the present invention.

FIG. 21 is a block diagram showing a configuration of a semiconductor integrated circuit device with fault analysis function according to the fourth embodiment of the present invention. In FIG. 21, the reference numbers 181 and 182 designate serial shift registers, respectively.

Other components in the semiconductor integrated circuit device of the fourth embodiment are the same as those of the first embodiment shown in FIG. 4, and therefore the explanation of the same components is omitted here.

Next, a description will be given of the operation of the fourth embodiment.

In the semiconductor integrated circuit device with fault analysis function shown in FIG. 4, address signals A<4:0> are transferred in parallel to both the RAM 1, 10 or 100 and the comparison control circuit 6, 60 or 600. However, the present invention is not limited by this configuration, for example, the following configuration of the semiconductor integrated circuit device with fault analysis function is acceptable and has the same effect of the configuration shown in FIG. 4. In the configuration shown in FIG. 21, the address signals A<4:0> are provided in serial to both the shift registers 181 and 182. When both the shift registers 181 and 182 perform shift operation simultaneously, the same address signals may be provided to both the RAM 1, 10 or 100 and the comparison control circuit 6, 60 or 600. These shift registers 181 and 182 may be formed by using serial shift registers.

As described above, according to the fourth embodiment, because the shift registers 181 and 182 are incorporated in the semiconductor integrated circuit device in order to provide the address signals A<4:0> in serial to both the comparison control circuit and the RAM, the number of I/O terminals that are necessary for fault test may be decreased.

Fifth Embodiment

Figure 22:
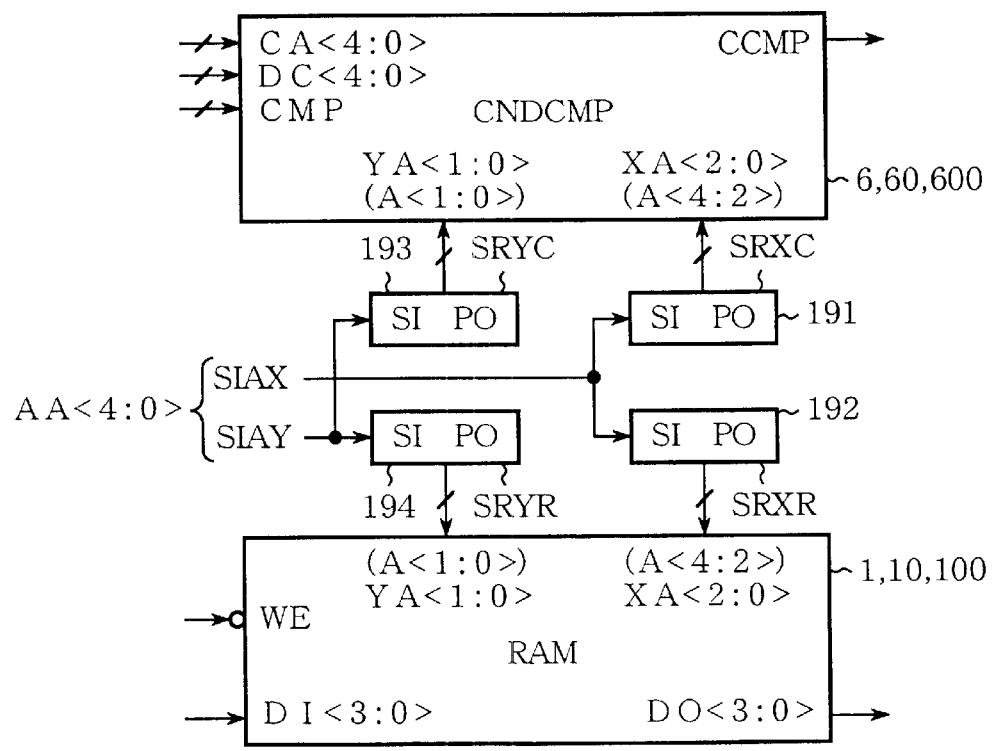
FIG. 22 is a block diagram showing a configuration of a semiconductor integrated circuit device with fault analysis function according to the fifth embodiment of the present invention.

FIG. 22 is a block diagram showing a configuration of a semiconductor integrated circuit device with fault analysis function according to the fifth embodiment of the present invention. In FIG. 22, the reference numbers 191 and 192 designate serial shift registers only for X address. The reference numbers 193 and 194 denote serial shift registers only for Y address, respectively. Other components in the semiconductor integrated circuit device of the fifth embodiment are the same as those of the first embodiment shown in FIG. 4, and therefore the explanation of the same components is omitted here.

Next, a description will be given of the operation of the fifth embodiment.

In the semiconductor integrated circuit device with fault analysis function shown in FIG. 21, both the X address and Y address are transferred to the comparison control circuit 6, 60 or 600 and the RAM 1, 10 or 100 simultaneously through the serial shift registers 181 and 182. However, the present invention is not limited by this configuration, for example, the following configuration of the semiconductor integrated circuit device with fault analysis function is acceptable and has the same effect of the configuration shown in FIG. 21. In the configuration, the serial shift registers 191 and 192 for X address and the serial shift registers 193 and 194 for Y address are incorporated independently in the semiconductor integrated circuit device. The addresses are thereby provided in serial to the comparison control circuit 6, 60 or 600 and the RAM 1, 10 or 100 through the serial shift registers 191, 192, 193 and 194.

As described above, according to the fifth embodiment of the present invention, because the serial shift registers 191, 192, 193 and 194 are incorporated in the semiconductor integrated circuit device in order to provide X address signals and Y address signals in the address signals A<4:0> individually and in serial to both the comparison control circuit and the RAM, the number of I/O terminals that are necessary for fault test may be decreased.

Sixth Embodiment

Figure 23:
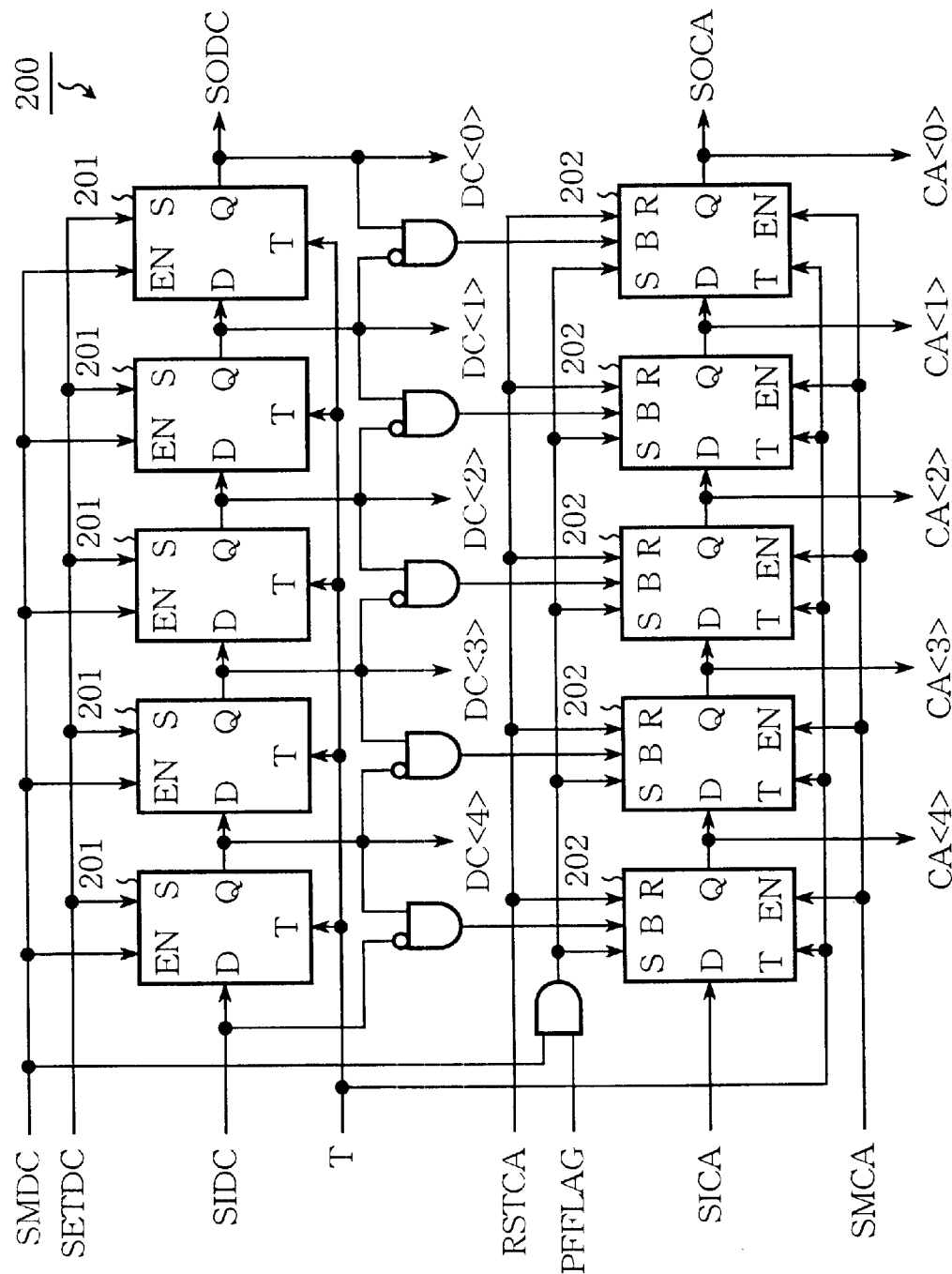
FIG. 23 is a block diagram showing a part of a configuration of a semiconductor integrated circuit device with fault analysis function according to the sixth embodiment of the present invention.

FIG. 23 is a block diagram showing a configuration of a part of a semiconductor integrated circuit device with fault analysis function according to the sixth embodiment of the present invention. In particular, FIG. 23 shows a configuration of a repetitive control circuit for searching an address where a fault of a single bit occurs. This repetitive control circuit corresponds to the self test controller whose function has been described in the explanation for the first through fifth embodiments.

The repetitive control circuit shown in FIG. 23 performs search operation in order to detect the address of a defective portion in the RAM based on a binary search algorithm. In FIG. 23, the reference number 200 designates the repetitive control circuit. The reference number 201 denotes shift registers arranged in five stages for inputting a serial control signal SIDC and outputting a serial control signal SODC. These shift registers 201 forms a serial shift register. The reference number 202 indicates shift registers arranged in five stages for inputting a serial control signal SICA and outputting a serial control signal SOCA. These shift registers 202 also forms a serial shift register. The control signals SODC and SOCA become the control signals DC< > and CA< >, respectively, to be provided to the comparison control circuit 6 shown in FIG. 4.

FIGS. 24A and 24B are diagrams showing a configuration of each of the shift resisters 201 in the repetitive control circuit 200 shown in FIG. 23. Further, FIGS. 25A to 25C are diagrams showing a configuration of each of the shift resisters 202 in the repetitive control circuit 200 shown in FIG. 23.

Next, a description will be given of the operation of the sixth embodiment.

(1) First, in the state of the control signals SIDC=0, SETDC=1 and SMDC=0 (to be provided to the shift registers 201 and 202), the clock signal T is provided only once to the repetitive control circuit 200 in order to set all of the control signal DC< > to 1. This causes the control signal BC<4:0>=10000.

(2) In the state of the control signals RSTCA=1 and SMCA=0, the clock signal T is provided only once to the repetitive control circuit 200 in order to set the control signal CA< > to 0.

(3) The memory test operation for the RAM 1 in the semiconductor integrated circuit device shown in FIG. 4 is performed and then obtained pass-fail information indicating test results are set as the control signal PFFLAG. In the pass-fail information, the value 1 indicates a pass state where there is no fail of a single bit in test objects and the value indicates a fail pass state where there is the fail of a single bit in test objects.

(4) Under the state of the control signals SIDC=0, SETDC=0, SNDC=1, RSTCA=0 and SMCA=0, the clock signal T is provided repeatedly to the repetitive control circuit 200.

(5) Next, the above processes (3) and (4) are repeated until the process (4) for the control signal DC<4:0>=00000 is completed.

The address of the fault portion in the RAM may be detected. After the process (5), it is possible to read the address indicating the fail portion serially through the shift registers 202. At this time, it is also possible to provide data from other shift registers in the semiconductor integrated circuit device to the SICA terminal of the shift registers 202.

As described above, according to the sixth embodiment, because the repetitive control circuit 200 is incorporated in the semiconductor integrated circuit device and the control signals DC< > and CA< > are provided to the comparison control circuit 6 and the results of the test for a single bit in the RAM 1 are set to the flag information PFFLAG, it is possible to perform a binary search for searching the addresses of defective memory cells in the RAM 1.

Seventh Embodiment

Figure 26:
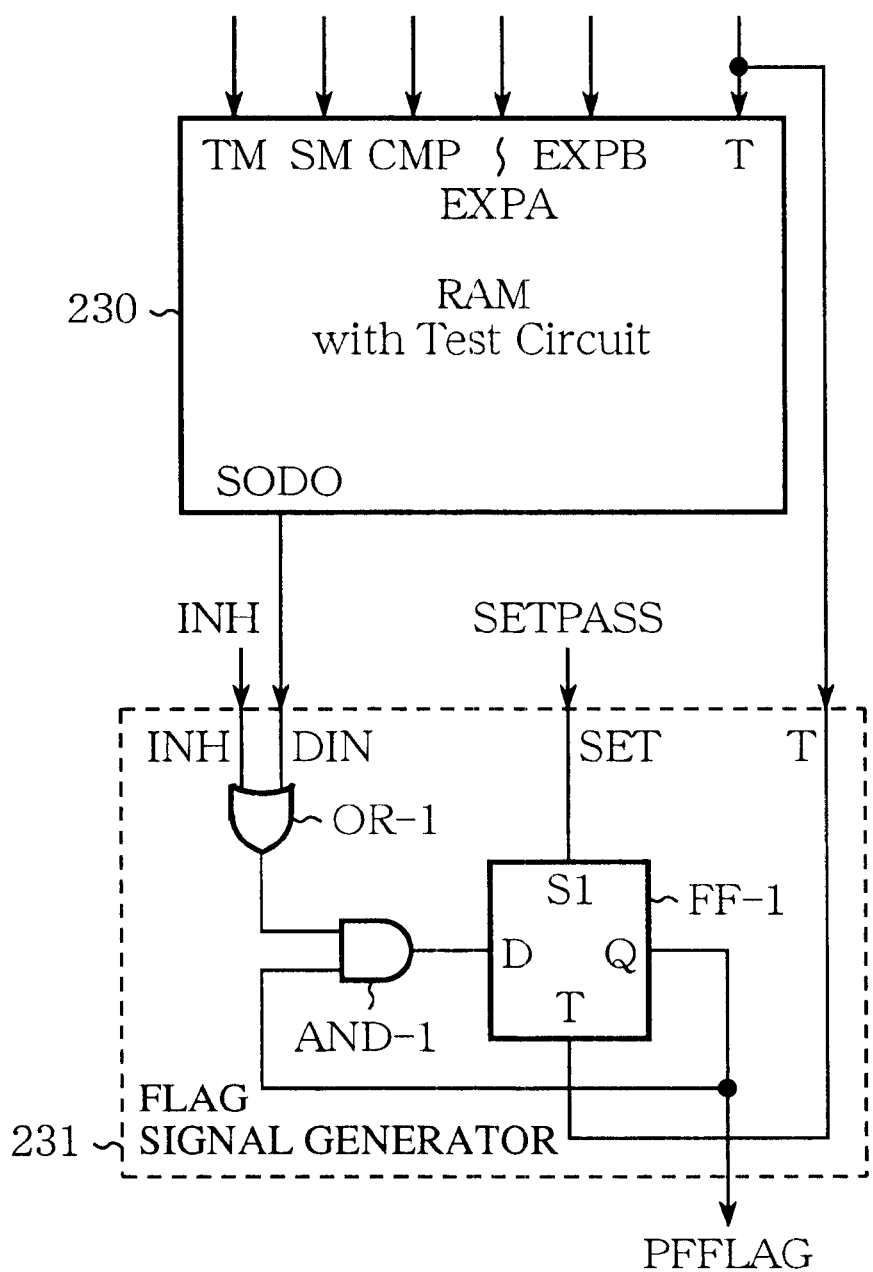
FIG. 26 is a block diagram showing a configuration of a flag signal generation circuit in a semiconductor integrated circuit device with fault analysis function according to the seventh embodiment of the present invention.

FIG. 26 is a block diagram showing a configuration of a flag signal generation circuit incorporated in a semiconductor integrated circuit device with fault analysis function according to the seventh embodiment of the present invention. In FIG. 26, the reference number 230 designates a semiconductor integrated circuit device with test circuit of fault analysis function. This test circuit comprises the RAM 1 and the scan flip flops 2, 3, 4 and 5, and the comparison control circuit 6 shown in FIG. 4, for example. The reference number 231 denotes the flag signal generation circuit to generate a flag signal PFFLAG indicating a pass-fail information as the test result. This flag signal PFFLAG of the value 1 means there is no defective portion in the RAM and of the value 0 means there is one or more defective portions in the RAM.

Next, a description will be given of the operation of the seventh embodiment.

The flag signal generation information 231 inputs the signal SODO indicating the test result from the RAM in the semiconductor integrated circuit device 230 through the terminal SODO and then generates the flag signal PFFALG.

(1) Firstly, the flag signal PFFALG is set to 1 based on the control signal SETPASS. This state of the flag signal PFFALG=1 indicates there is no fault in the RAM.

(2) Test operation for the RAM in the semiconductor integrated circuit device 230 is executed.

(3) While reading the test results through the terminal SODO, the control signal INH is set to 0 (INH=0) for effective data in order to detect a fault. When there is a fault, the flag signal PFFLAG is changed to 0 (fail state, PFFLAG=0) when no fault, the flag signal PFFLAG remains at 1.

Figure 27:
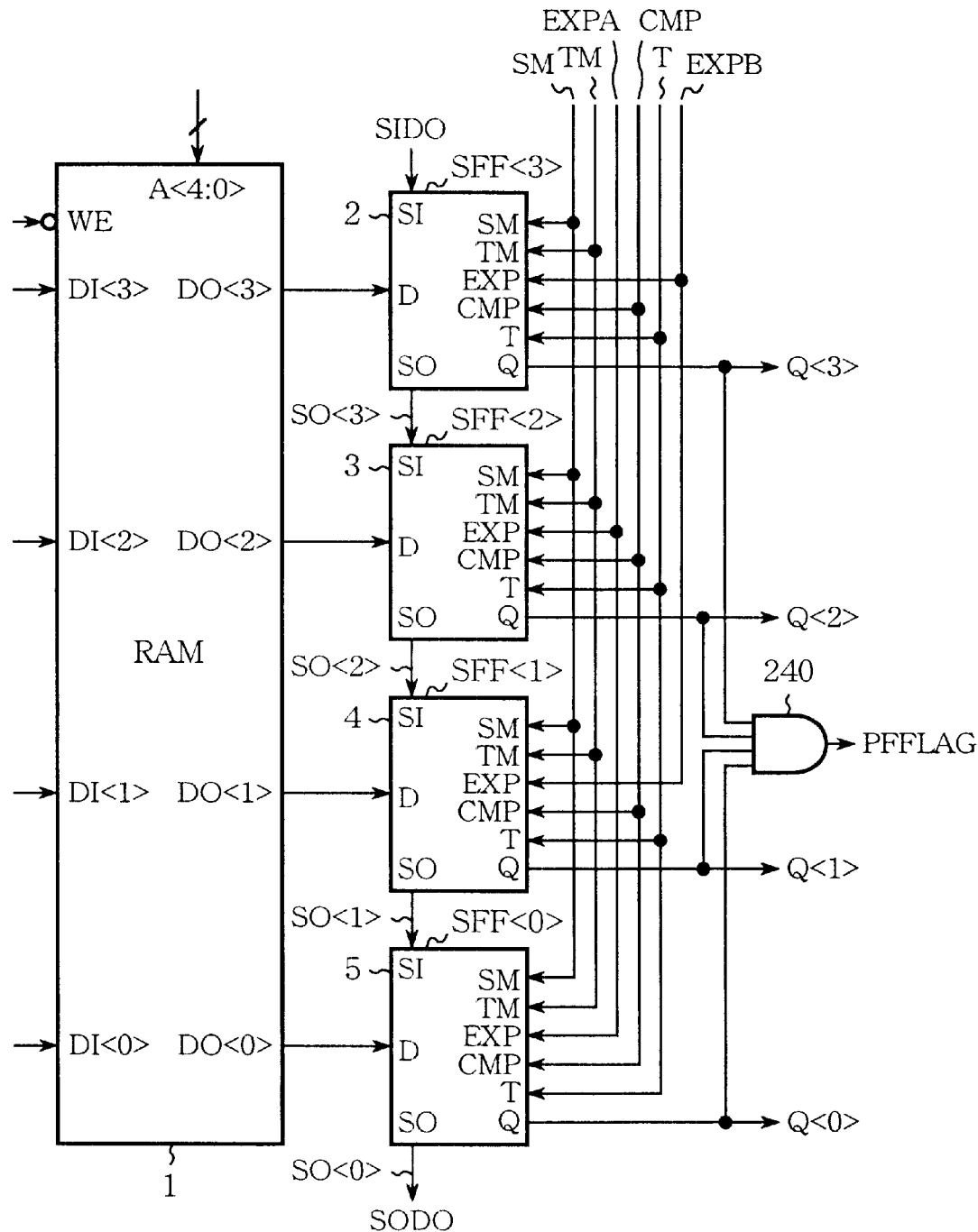
FIG. 27 is a block diagram showing another configuration of the flag signal generation circuit.

FIG. 27 is a block diagram showing another configuration of the flag signal generation circuit. In FIG. 27, the reference number 240 designates an AND circuit for outputting the flag signal PFFLAG. This AND circuit 240 means the flag signal generation circuit. When outputting the flag signal PFFLAG=1, it may be detected there is no fault (pass state), and when the flag signal PFFLAG=0, there is a fault (fail state).

The AND circuit 240 as the flag signal generation circuit shown in FIG. 27 inputs the signals Q<3:0> (Q<3>, Q<2>, Q<1> and Q<0>) transferred from the scan flip flops 2, 3, 4 and 5. The AND circuit 240 performs AND operation among the signals Q<3>, Q<2>, Q<1> and Q<0>, and then generates the control signal PFFLAG.

Figure 28:
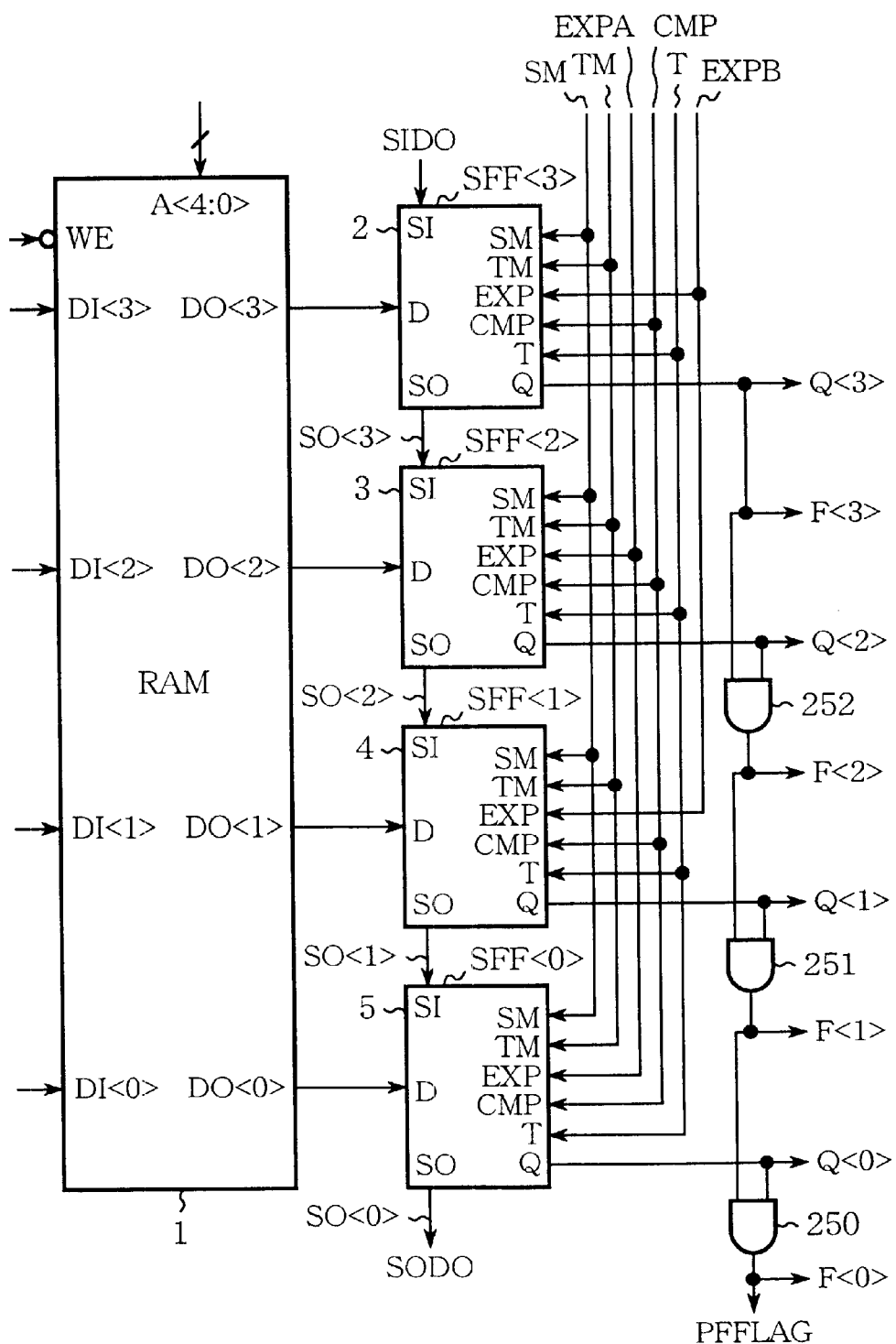
FIG. 28 is a block diagram showing another configuration of the flag signal generation circuit.

FIG. 28 is a block diagram showing another configuration of the flag signal generation circuit. In FIG. 28, the reference numbers 250, 251 and 252 designate AND circuits as the flag signal generation circuit. The AND circuit 252 performs AND operation between the signals Q(3) and Q(2) output from the scan flip flops 2 and 3, respectively. The AND circuit 251 performs AND operation between the signal Q(1) output from the scan flip flop 4 and the output from the AND circuit 252. The AND circuit 250 performs AND operation between the signal Q(0) output from the scan flip flop 5 and the output from the AND circuit 251.

Thus, the flag signal generation circuit shown in FIG. 28 comprises the AND circuits 250, 251 and 252 connected in series and outputs the flag signal PFFLAG.

Figure 29:
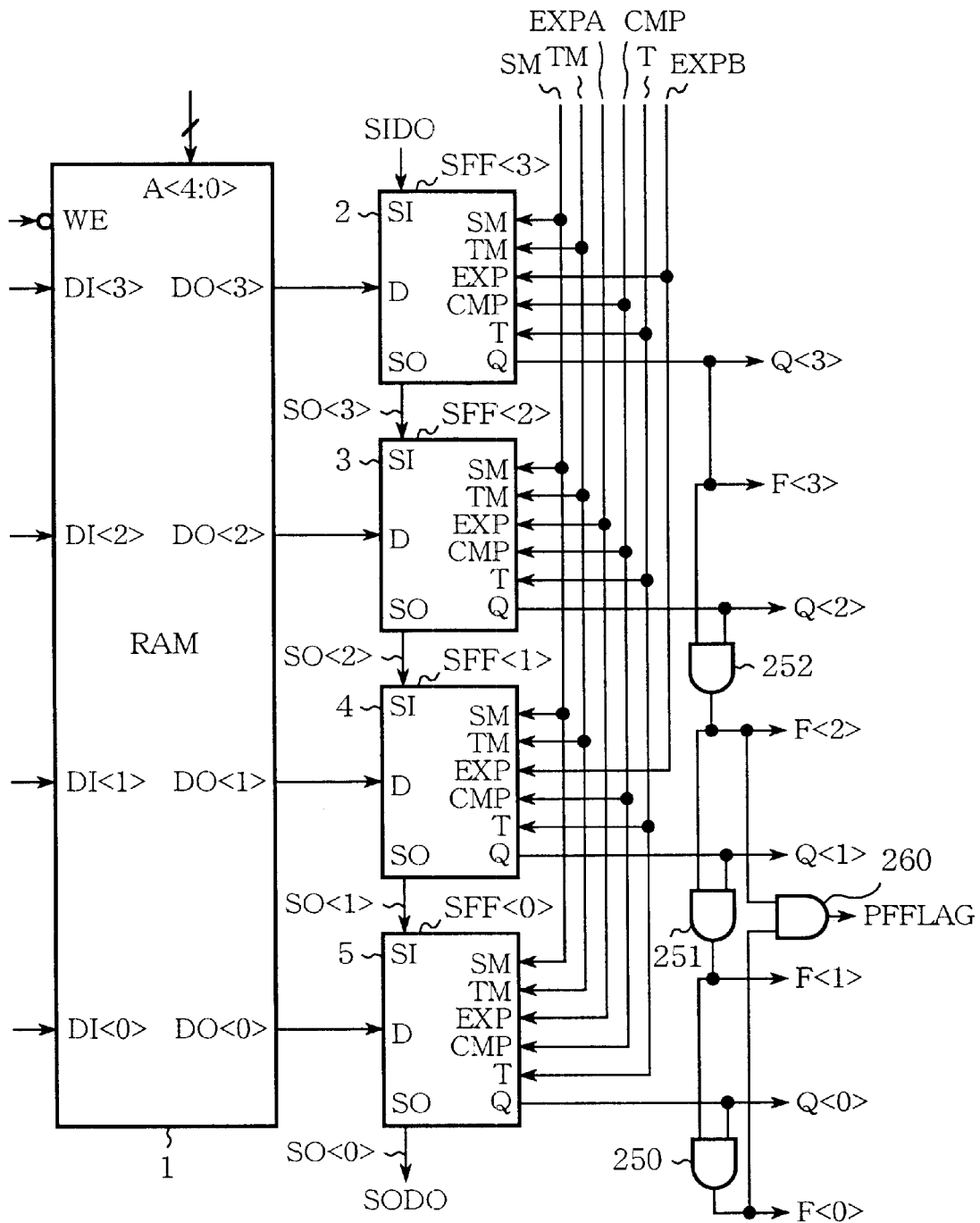
FIG. 29 is a block diagram showing another configuration of the flag signal generation circuit.

FIG. 29 is a block diagram showing another configuration of the flag signal generation circuit. In FIG. 29, the reference number 260 designates an AND circuit. Other components of the flag signal generation circuit shown in FIG. 29 are the same as those of the flag signal generation circuit shown in FIG. 28.

The flag signal generation circuit shown in FIG. 29 has the configuration in which the AND circuit 260 (that perform AND operation between the outputs from both the AND circuit 252 and the AND circuit 250) is further added in the configuration shown in FIG. 28. Accordingly, when compared with the configuration shown in FIG. 28, it is possible to reduce the stage number of the gates in delay and thereby possible to obtain the test result at high speed.

FIGS. 30A, 30B, 30C and 30D are block diagrams showing another configuration of the flag signal generation circuit. FIGS. 30A, 30B, 30C and 30D show a case where the concept of the flag signal generation circuit shown in FIG. 29 is applied to a 8 bit RAM. FIGS. 30A, 30B, 30C and 30D mainly show a part of the AND circuits in the flag signal generation circuit. However, FIGS. 30A, 30B, 30C and 30D do not show the RAM as the semiconductor integrated circuit device with fault analysis function and the scan flip flops.

Figure 30A:
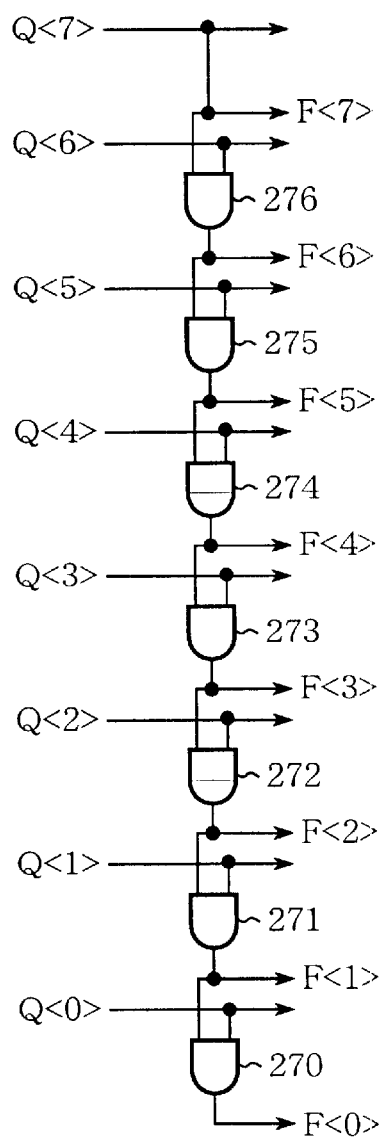

FIG. 30A shows the configuration of the AND circuits 270 to 276 forming the flag signal generation circuit. Each of the AND circuits 270 to 276 performs AND operation between the value of the signal Q< > transferred from corresponding scan flip flop in eight scan flip flops (not shown) and the output from the AND circuit in the upper stage. These eight scan flip flops corresponding to a 8 bit RAM are connected in series.

Taking a concrete example, the AND circuit 276 performs AND operation between the signal Q<7> from the scan flip flop in the uppermost stage and the signal Q<6> from the scan flip flop in the following stage.

Further, the AND circuit 275 performs AND operation between the output from the AND circuit 276 and the signal Q<5> from the scan flip flop in the following stage. The AND circuit 274 performs AND operation between the output from the AND circuit 275 and the signal Q<4> from the scan flip flop in the following stage. The AND circuit 273 performs AND operation between the output from the AND circuit 274 and the signal Q<3> from the scan flip flop in the following stage. The AND circuit 272 performs AND operation between the output from the AND circuit 273 and the signal Q<2> from the scan flip flop in the following stage. The AND circuit 271 performs AND operation between the output from the AND circuit 272 and the signal Q<1> from the scan flip flop in the following stage. The AND circuit 270 performs AND operation between the output from the AND circuit 271 and the signal Q<0> from the scan flip flop in the final stage.

Figure 30B:
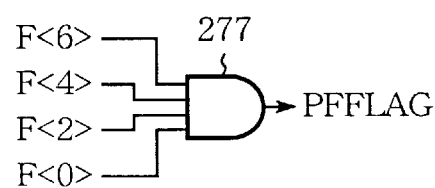

FIG. 30B shows the configuration in which the AND circuit 277 to perform AND operation among outputs from the AND circuits 276, 274, 272 and 270 is added in the configuration of the AND circuits 270 to 276 forming the flag signal generation circuit shown in FIG. 30A. This configuration may generate the flag signal PFFLAG within a delay of the AND circuits in three stages. On the other hand, in the configuration shown in FIG. 30A, the output from the AND circuit 270 is used as the flag signal PFFLAG. This configuration generates a delay of the AND circuit of the seven stages. Accordingly, the operation speed of the configuration shown in FIG. 30B is higher than that of the configuration shown in FIG. 30A.

Figure 30C:
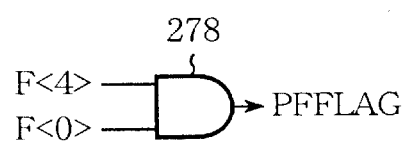

FIG. 30C shows the configuration in which the AND circuit 278 is added in the configuration of the AND circuits 270 to 276 forming the flag signal generation circuit shown in FIG. 30A. This AND circuit 278 performs AND operation between the outputs from the AND circuits 270 and 274 This configuration may generate the flag signal PFFLAG within a delay of the AND circuits in five stages.

When a system may accept the delay of the AND circuits in the five stages, it is possible to form the AND circuit 278 by using an AND circuit having a smaller number of inputs when compared with the configuration shown in FIG. 30B.

Figure 30D:
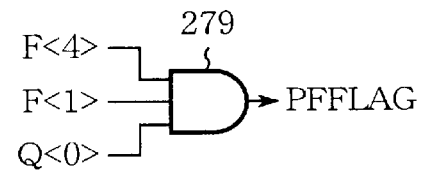

FIG. 30D shows the configuration in which the AND circuit 279 is added in the configuration of the AND circuits 270 to 276 forming the flag signal generation circuit shown in FIG. 30A. The AND circuit 279 performs AND operation between the signal Q<0> from the scan flip flop in the final stage and the outputs from the AND circuits 274 and 271. This configuration may also generate the flag signal PFFLAG.

Figure 31A:
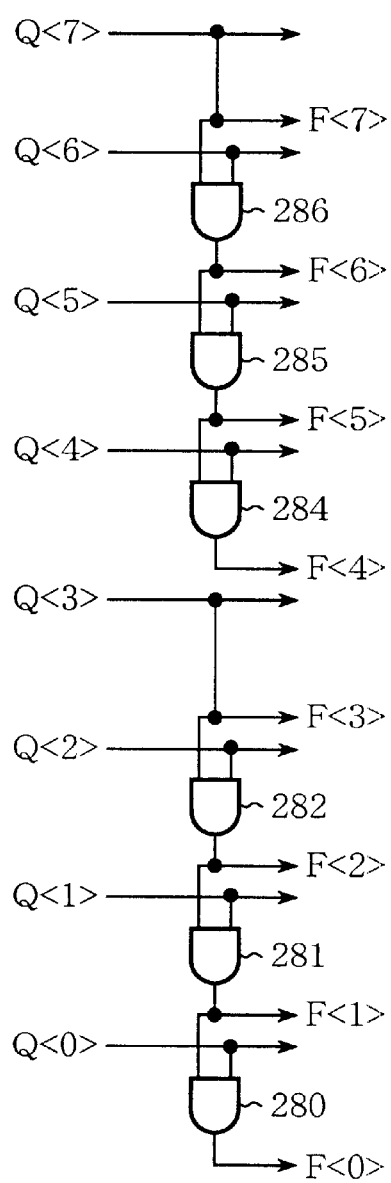
FIGS. 31A to 31C are block diagrams showing another configuration of the flag signal generation circuit.
Figure 31B:
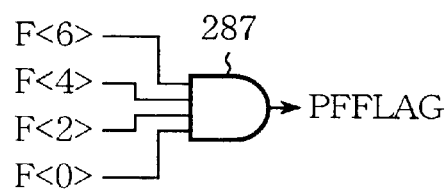
Figure 31C:
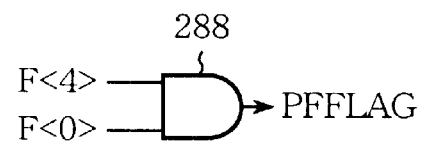

FIGS. 31A to 31C are block diagrams showing another configuration of the flag signal generation circuit in which two groups of AND circuits 280 to 282 and 284 to 286 are incorporated. The AND circuits 280 to 282 in one group are connected in series. The AND circuits 284 to 286 in the other group are also connected in series. Each of the AND circuits 280 to 282 and 284 to 286 performs AND operation between the output from the AND circuit in the upper stage and the signal Q< > from each of eight scan flip flops incorporated corresponding to a 8 bit RAM.

Taking a concrete example, the AND circuit 286 performs AND operation between the signal Q<7> from the scan flip flop in the uppermost stage and the signal Q<6> from the scan flip flop in the following stage.

Further, the AND circuit 285 performs AND operation between the output from the AND circuit 286 and the signal Q<5> from the scan flip flop in the following stage. The AND circuit 284 performs AND operation between the output from the AND circuit 285 and the signal Q<4> from the scan flip flop in the following stage.

The AND circuit 282 performs AND operation between the output from the signal Q<3> from the scan flip flop in the fourth stage and the signal Q<2> from the scan flip flop in the following stage. The AND circuit 281 performs AND operation between the output from the AND circuit 282 and the signal Q<1> from the scan flip flop in the following stage. Finally, the AND circuit 280 performs AND operation between the output from the AND circuit 281 and the signal Q<0> from the scan flip flop in the final stage.

FIG. 31B shows the configuration in which the AND circuit 287 is added in the configuration of the AND circuits 280 to 282, and 284 to 286 forming the flag signal generation circuit shown in FIG. 31A. The AND circuit 287 performs AND operation among outputs from the AND circuits 286, 284, 282 and 280. This configuration shown in FIG. 31B may generate the flag signal PFFLAG within a delay of the AND circuits in three stages. The flag signal generation circuit shown in FIG. 31B may perform the operation at high speed when compared with the flag signal generation circuit having the configuration shown in FIG. 31A.

FIG. 31C shows the configuration in which the AND circuit 288 is added in the configuration of the AND circuits 280 to 282, and 284 to 286 forming the flag signal generation circuit shown in FIG. 31A. The AND circuit 288 performs AND operation between the outputs from the AND circuits 280 and 284. This configuration shown in FIG. 31C may generate the flag signal PFFLAG within a delay of the AND circuits in three stages. The flag signal generation circuit shown in FIG. 31C may be formed by using AND circuits having small number of inputs when compared with the configuration of the flag signal generation circuit shown in FIG. 31B.

As described above, according to the seventh embodiment, it is thereby possible to generate the flag signal PFFLAG at high speed because the flag signal generation circuit is formed by using AND circuits in first and second stages. These configurations of the seventh embodiment shown in FIGS. 31A, 31B, and 31C can perform the fault analysis for RAM efficiently.

By means of the present invention which has been explained in detail described above, it is possible to perform fault diagnosis and analysis for various fault modes such as a fault of a specified memory cell (single bit fault), fault of bit line and fault of word line and the like because the comparison control circuit selects a combination of memory cells consisting of a single memory cell, memory cells of two or more, a specified bit, a specified row, or a combination of memory cells X addresses or Y addresses of which are scrambled based on the control signal CA< >, DC< >, CMP and the like provided from the self test controller, and the comparison control circuit then generates the comparison control signal that indicates the initiation of the comparison operation for the output from the object memory cell only when the address indicates the object memory cell for test, and provides the generated comparison control signal to the scan flip flops incorporating the comparator.

By the present invention, it is possible to reduce the number of terminals to be used for test because the shift registers are incorporated in the semiconductor integrated circuit device and the address signal may be provided to the comparison control circuit and the memory circuit simultaneously and in serial.

According to the present invention, it is possible to perform the binary search operation for searching the address of a faulty memory cell in a memory cell circuit in binary search because the repetitive control circuit is incorporated and the control signals DC< > and CA< > are provided to the comparison control circuit and the test result of the signal bit in the memory cell circuit may be obtained as the flag information PFFLAG.

In addition, according to the present invention, it is possible to generate the flag signal PFFLAG at high speed and also possible to perform the fault analysis for the memory circuit efficiently because the flag signal generation circuit is formed by using the AND circuits in the first and second stages.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit device with fault analysis function, comprising:
   a memory circuit comprising a plurality of memory cells that are divided into a plurality of memory cell groups in which data stored in said memory cells addressed by address signals are read and then output;
   a scan path comprising a plurality of scan flip flops placed corresponding to said plurality of memory cell groups, each scan flip flop including a comparator for comparing said data read from said memory cells with expected values that have been previously prepared and then outputting a comparison result; and
   a comparison control circuit for inputting control signals and said address signal, generating a comparison control signal in order to initiate comparison operation between said data and said expected values by said comparators when said memory cells addressed by said address signals are equal to memory cells of at least one or more in each memory cell group within a range specified by said control signals which can be less than all memory cells within respective memory cell groups, and outputting said comparison control signal to each of said plurality of scan flip flops.

2. A semiconductor integrated circuit device with fault analysis function according to claim 1, said comparison control circuit outputs said comparison control signal to said plurality of scan flip flops in order to initiate comparison operation only for memory cells which are addressed by a specified single address.

3. A semiconductor integrated circuit device with fault analysis function according to claim 1, said comparison control circuit outputs said comparison control signal to said plurality of scan flip flops in order to initiate comparison operation for all of memory cells other than memory cells which are addressed by a specified single address.

4. A semiconductor integrated circuit device with fault analysis function according to claim 1, said comparison control circuit outputs said comparison control signal to said plurality of scan flip flops in order to initiate comparison operation for memory cells in said memory cell groups corresponding to a word line.

5. A semiconductor integrated circuit device with fault analysis function according to claim 1, said comparison control circuit outputs said comparison control signal to said plurality of scan flip flops in order to initiate comparison operation for memory cells in said memory cell groups addressed by a plurality of word lines the number of which is less than the number of all of word lines in each memory cell group.

6. A semiconductor integrated circuit device with fault analysis function according to claim 1, said memory cell groups having memory cells that are object memory cells for said comparison operation specified by said comparison control signal generated by and output from said comparison control circuit are addressed by a plurality of word lines that are adjacent to each other.

7. A semiconductor integrated circuit device with fault analysis function according to claim 1, said comparison control circuit outputs to said plurality of scan flip flops said comparison control signal in order to initiate comparison operation only for memory cells in said memory cell groups corresponding to word lines that are not adjacent to each other.

8. A semiconductor integrated circuit device with fault analysis function according to claim 1, said comparison control circuit outputs to said plurality of scan flip flops said comparison control signal in order to initiate comparison operation only for memory cells in each memory cell group corresponding to a bit line.

9. A semiconductor integrated circuit device with fault analysis function according to claim 1, said comparison control circuit outputs to said plurality of scan flip flops said comparison control signal in order to initiate comparison operation only for memory cells in each memory cell group corresponding to a plurality of bit lines.

10. A semiconductor integrated circuit device with fault analysis function according to claim 1, said memory cell groups having memory cells as object memory cells for comparison operation indicated by said comparison control signal generated by and output from said comparison control circuit are memory cell groups indicated by a plurality of bit lines that are adjacent to each other.

11. A semiconductor integrated circuit device with fault analysis function according to claim 1, said memory cell groups having memory cells as object memory cells for comparison operation indicated by said comparison control signal generated by and output from said comparison control circuit are memory cell groups indicated by bit lines other than a plurality of bit lines that are adjacent to each other.

12. A semiconductor integrated circuit device with fault analysis function according to claim 1, said comparison control circuit outputs to said plurality of scan flip flops said comparison control signal to initiate comparison operation only for alternate memory cells arranged in a lattice shape in each memory cell group.

13. A semiconductor integrated circuit device with fault analysis function according to claim 1, further comprises a repetitive control circuit for inputting said comparison result from said comparator incorporated in each of said plurality of scan flip flops, generating a control signal to switch said memory cells specified by said comparison control signal output from said comparison control circuit according to said comparison result, and outputting said control signal to said comparison control circuit in order to perform said comparison operation for said memory cells repeatedly.

14. A semiconductor integrated circuit device with fault analysis function according to claim 1, further comprises AND circuits arranged in first and second stages, wherein said AND circuits in first stage perform AND operation between outputs from adjacent scan flip flops in said plurality of scan flip flops that form said scan path, and said AND circuits in second stage perform AND operation between outputs from specified AND circuits in said AND circuits in first stage.

15. A semiconductor integrated circuit device with fault analysis function according to claim 1, further comprises shift registers for providing said address signals serially and simultaneously to both said memory circuit and said comparison control circuit.

16. A semiconductor integrated circuit device with fault analysis function according to claim 15, wherein said shift registers are placed corresponding to each of X address signals and Y address signals in said address signals.

* * * * *